United States Patent [19]
Toyama et al.

[11] Patent Number: 5,496,677
[45] Date of Patent: Mar. 5, 1996

[54] PRESENSITIZED PLATE FOR USE IN MAKING LITHOGRAPHIC PRINTING PLATE COMPRISING A MAT LAYER AND COATING LAYER ON THE BACK FACE OF THE SUBSTRATE

[75] Inventors: Tadao Toyama; Hitoshi Hagiwara; Nobuyuki Kita, all of Shizuoka, Japan

[73] Assignee: Fuji Photo Film Co., Ltd., Minami-ashigara, Japan

[21] Appl. No.: 357,085

[22] Filed: Dec. 15, 1994

Related U.S. Application Data

[63] Continuation of Ser. No. 928,361, Aug. 12, 1992, abandoned.

[30] Foreign Application Priority Data

| Aug. 19, 1991 | [JP] | Japan | 3-206964 |
| Dec. 3, 1991 | [JP] | Japan | 3-318258 |
| Mar. 16, 1992 | [JP] | Japan | 4-57902 |

[51] Int. Cl.$^6$ ............ G03F 7/11; G03F 7/021; G03F 7/023; G03F 7/032
[52] U.S. Cl. ............ 430/162; 430/166; 430/273.1; 430/278.1; 430/302
[58] Field of Search ............ 430/166, 162, 430/271, 273, 276, 302, 278, 158

[56] References Cited

U.S. PATENT DOCUMENTS

| 4,238,560 | 12/1980 | Nakamura et al. | 430/162 |
| 4,268,611 | 5/1981 | Okishi et al. | 430/162 |
| 4,355,093 | 10/1982 | Hartmann et al. | 430/273 |
| 4,544,622 | 10/1985 | Kausch | 430/278 |
| 5,254,432 | 10/1993 | Aoai | 430/278 |
| 5,260,161 | 11/1993 | Matsumura et al. | 430/278 |

*Primary Examiner*—John S. Y. Chu
*Attorney, Agent, or Firm*—Burns, Doane, Swecker & Mathis

[57] ABSTRACT

A presensitized plate for use in making a lithographic printing plate comprises a substrate; a photosensitive layer and a mat layer whose projections have an average diameter of not more than 100 μm, an average height of not more than 10 μm and whose coated amount ranges from 5 to 200 mg/m$^2$, the photosensitive layer and the mat layer being applied onto the upper surface of the substrate; and a coating layer of an organic polymeric compound having a glass transition point of not less than 20° C. and a thickness ranging from 0.01 to 8.0 μm, the coating layer being applied onto the back face of the substrate. The presensitized plate makes it possible to solve the problem of the formation of scratches and the adhesion of the photosensitive layer to the back face of the PS plate even when a large number of PS plates are transported and/or stored while putting them in piles without sandwiching the PS plate between interleaves. The coated layer applied to the back face of the PS plate is tough and shows good adhesion to the substrate and is not peeled off during handling, development processing and printing operations.

16 Claims, No Drawings

PRESENSITIZED PLATE FOR USE IN MAKING LITHOGRAPHIC PRINTING PLATE COMPRISING A MAT LAYER AND COATING LAYER ON THE BACK FACE OF THE SUBSTRATE

This application is a continuation, of application Ser. No. 07/928,361, filed Aug. 12, 1992, now abandoned.

BACKGROUND OF THE INVENTION

The present invention relates to a presensitized plate for use in making a lithographic printing plate (hereinafter referred to as "PS plate") and more specifically to a PS plate in which a coating layer of an organic polymeric compound is applied onto the back face thereof.

A positive-working PS plate which has been widely used comprises an aluminum plate serving as a support provided thereon with a photosensitive layer comprising an o-quinonediazide compound. It has been known that the o-quinonediazide compound is converted into a carboxylic acid through the irradiation with ultraviolet rays and accordingly if an exposed PS plate is developed with an aqueous alkaline solution, only the area on the photosensitive layer exposed to light is removed to expose the support surface. Since the surface of the aluminum support is hydrophilic, the surface (non-image area) of the support exposed through the development retains water and repels a printing ink. On the other hand, the area (image area) from which the photosensitive layer is not removed through the development is lipophilic. Therefore, the image area repels water and receives a printing ink.

On the other hand, a known negative-working PS plate comprises a substrate provided thereon with a photosensitive layer of a photosensitive diazonium salt, a photosensitive layer comprising a photopolymerizable monomer or a photo-crosslinkable photosensitive layer comprising cinnamic acid and a polymeric compound having dimethylmaleimido groups. The photosensitive layer is hardened through irradiation with light and only the unexposed area is removed by developing with a proper developer to likewise give a lithographic printing plate.

These PS plates have often been damaged when they are transported while putting a large number of these PS plates in layers.

Such defects are formed for the reason that a mat layer applied onto a photosensitive layer has insufficient slip characteristics with respect to the back face of an aluminum substrate and accordingly, the mat layer and the back face are rubbed together during transporting them in layers to thus damage the photosensitive layer. The mat layer is in general applied onto the photosensitive layer for reducing the time required for getting a vacuum during contact exposure to light in a vacuum printing frame and for preventing an image becoming indistinct. Moreover, when a large number of PS plates are stored while putting them in layers, it has sometimes been observed that the back face of the substrate is adhered to a photosensitive layer due to a load applied thereto and cannot be peeled off.

These problems have in general been solved by inserting an interleaf between neighbouring two PS plates put in layers.

However, if a large number of PS plates are used, it requires much labor to remove the interleaf and a great deal of interleaves are discharged as industrial waste. In particular, environmental protection has presently been advocated on a worldwide scale and, therefore, the amount of industrial waste should be reduced.

To eliminate this drawback, Japanese Patent Publication for Opposition Purpose (hereinafter referred to as "J. P. KOKOKU") No. Sho 51-6570 discloses a technique in which an easily peelable protective layer having a thickness ranging from 10 to 100 µ is applied onto the surface of a photosensitive layer or the back face of the substrate for PS plate. This technique makes it possible to eliminate the problem of scratches which are possibly formed during handling PS plates while putting them in layers, but cannot solve the problem of the adhesion of a photosensitive layer to a protective layer and further the protective layers peeled off have still been discharged as industrial waste.

Alternatively, Japanese Unexamined Patent Publication (hereinafter referred to as "J. P. KOKAI") No. Sho 50-151136 discloses a method comprising applying a layer of a soft polymer or paper onto the back face of a substrate; J. P. KOKAI No. Sho 57-63293 discloses a method comprising applying a protective layer of a polymer having a melting point of not more than 120 ° C. onto a composite substrate which comprises a surface-grained aluminum plate and a steel plate on the steel plate side (the side opposite to a photosensitive layer); J. P. KOKAI No. Sho 60- 73538 discloses a method comprising applying a protective layer onto the back face of a substrate, the protective layer being peeled off prior to the development thereof; and J. P. KOKAI No. Sho 61-67863 discloses a PS plate provided with a layer of an organic polymer having a thickness of not more than 100 µ on the back face thereof. These prior art techniques are developed with emphasis on cutting the PS plates while putting them in layers and thus disclose that the preferred thickness of the protective layer should be not less than 100 µm and that a relatively soft polymer is preferably used. In fact, a protective layer of a low density polyethylene having a thickness of not less than 10 µm is favorable for cutting a plurality of PS plates put in piles. However, these PS plates are not designed in full consideration of the sliding of the photosensitive layer on the back face of the aluminum substrate and accordingly, the surface of the photosensitive layer is often damaged upon transporting these PS plates in piles.

Moreover, protective layers are swollen with an agent used during printing depending on materials used for forming the protective layers and the printing durability of the lithographic printing plate is deteriorated due to a change in the printing pressure. This problem is caused for the reason that the thickness of the protective layer is relatively thick in the order of not less than 10 µm. J. P. KOKOKU No. Sho 55-48296 discloses a method comprising applying a layer capable of absorbing infrared light onto the back face of an aluminum substrate whose surface is mechanically, chemically or electrochemically roughened and provided thereon with a photosensitive layer and then heating (or burning) the plate from the back face. However, the IR-absorbing layer comprises, for instance, pigments (e.g., carbon black) or hard particles (e.g., fine metal particles) as an IR-absorber and thus the PS plate is not designed in full consideration of slip characteristics like the foregoing techniques. Therefore, the problem of scratches of the photosensitive layer cannot be solved and accordingly, the use of an interleaf is essential for these PS plates.

On the other hand, there has been known a PS plate comprising a substrate whose both surfaces are grained and provided with photosensitive layers on both sides of the substrate. It is likewise essential for these PS plates to use an interleaf for preventing the formation of scratches on the photosensitive layer.

SUMMARY OF THE INVENTION

Accordingly, an object of the present invention is to provide an improved PS plate which does not require the use of an interleaf and hence makes it possible to reduce the amount of industrial waste.

Another object of the present invention is to provide an improved PS plate which does not suffer from the problem of scratches due to rubbing and adhesion of the PS plates observed upon putting these PS plates in layers without using an interleaf which is subsequently discharged as industrial waste.

The inventors of this invention have conducted various studies to accomplish the foregoing objects, have found that the foregoing problems of the formation of scratches and the adhesion can effectively be solved by applying a thin layer of a relatively hard organic polymeric compound to the back face of a substrate and applying a specific mat layer onto a photosensitive layer and have thus completed the present invention.

According to the present invention, there is provided a PS plate which comprises a substrate; a photosensitive layer and a mat layer whose projections have an average diameter of not more than 100 µm, an average height of not more than 10 µm and whose coated amount ranges from 5 to 200 mg/m$^2$, the photosensitive layer and the mat later being applied onto the upper face of the substrate; and a coating layer of an organic polymeric compound having a glass transition point of not less than 20° C. and a thickness ranging from 0.01 to 8.0 µm on the back face of the substrate.

DESCRIPTION OF THE PREFERRED EMBODIMENTS

The PS plate of the present invention will be detailed below.

Supports

The supports used for the production of the PS plate of the present invention are dimensionally stable plate-like materials and include, for example, paper, paper laminated with a plastic film (such as polyethylene, polypropylene or polystyrene film) and metal plates such as aluminum (including alloys thereof), zinc, iron and copper plates. In particular, the optimum results of the present invention can be obtained when a metal plate such as an aluminum plate is used as a substrate. Preferred aluminum plates are, for instance, those of pure aluminum or an aluminum alloy comprising aluminum and a trace amount of other elements as well as plastic films laminated with an aluminum film or on which aluminum is vapor-deposited. Examples of the trace elements are silicon, iron, manganese, copper, magnesium chromium, zinc, bismuth, nickel and/or titanium. The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art. The aluminum plate used in the invention has a thickness on the order of about 0.1 to 0.6 mm.

The aluminum plate is optionally subjected to degreasing with, for instance, a solution containing a surfactant, an organic solvent or an alkaline aqueous solution for the removal of the rolling oil adhered to the surface thereof prior to a surface-roughening treatment.

First, an aluminum plate as a support for a PS plate is surface-roughened. Such surface-roughening treatments are, for instance, mechanical surface-roughening treatments, methods for electrochemically dissolving the surface and methods for chemically selectively dissolving the surface. The mechanical surface-roughening treatments can be carried out by any known methods such as ball graining, brush graining, blast graining and buff graining methods. In addition, the electrochemical surface-roughening treatment is, for instance, performed by passing an alternating or direct current through the aluminum plate in an electrolyte such as hydrochloric acid or nitric acid. Moreover, it is also possible to use combinations of these two kinds of methods as disclosed in J. P. KOKAI No. Sho 54-63902.

The aluminum plate thus surface-roughened may optionally be subjected to alkali etching and neutralization treatments and thereafter, anodized for improving the water retention and wear resistance of the surface. Any electrolyte can be used in the anodization treatment of an aluminum plate as long as they can form a porous anodized layer and generally include, for instance, sulfuric acid, phosphoric acid, oxalic acid, chromic acid or mixture thereof. The concentration of these electrolytes are appropriately determined depending on the kinds of the electrolytes selected.

The conditions for the anodization variously vary depending on the kinds of the electrolytes selected, but in general the anodization is preferably performed at an electrolyte concentration ranging from 1 to 80% by weight, an electrolyte temperature ranging from 5° to 70° C., a current density ranging from 5 to 60 A/dm$^2$ and a voltage ranging from 1 to 100 V for 10 seconds to 5 minutes.

The amount of the anodized layer is preferably not less than 1.0 g/m$^2$ and more preferably 2.0 to 6.0 g/m$^2$. This is because if it is less than 1.0 g/m$^2$, the resulting lithographic printing plate has insufficient printing durability and the non-image portion thereof is easily damaged, which leads to the occurrence of so-called "contamination due to defects", i.e., the adhesion of ink to defects during printing operation.

After the foregoing treatments, the aluminum plate is then hydrophilized, if desired. The hydrophilization thereof can be carried out by any conventionally known method. An example of the hydrophilization treatment used in the present invention is an alkali metal silicate (such as an aqueous sodium silicate solution) treatment as disclosed in U.S. Pat. Nos. 2,714,066, 3,181,461, 3,280,734 and 3,902,734. In the method, a substrate is treated by immersing or electrolyzing in an aqueous solution of sodium silicate. Examples of other hydrophilization treatments are treatments with potassium fluorozirconate as disclosed in J. P. KOKOKU No. Sho 36-22063 and a treatment with polyvinyl phosphonic acid as disclosed in U.S. Pat. Nos. 3,276,868, 4,153,461 and 4,689,272.

Organic Underlying Layer

An organic underlying layer is also applied, if desired, onto the aluminum plate prior to the application of a photosensitive layer. Organic compounds used in the organic underlying layer are, for instance, carboxymethyl cellulose, dextrin, gum arabic, organophosphonic acids optionally having substituents such as phenylphosphonic acid, naphthylphosphonic acid, alkylphosphonic acid, glycerophosphonic acid, methylenediphosphonic acid and ethylenediphosphonic acid, organophosphoric acids optionally having substituents such as phenylphosphoric acid, naphthylphosphoric acid, alkylphosphoric acid and glycerophosphoric acid, organophosphinic acid optionally having substituents such as phenylphosphinic acid, naphthylphosphinic acid, alkylphosphinic acid and glycerophosphinic acid, amino acids such as glycine and β-alanine, hydrochlorides of amines having hydroxyl groups such as triethanolamine hydrochloride, and mixture thereof.

In the present invention, the organic underlying layer can be formed by a method comprising the steps of applying a solution of the foregoing organic compound dissolved in water, an organic solvent such as methanol, ethanol, methyl ethyl ketone or a mixture thereof to the hydrophilized aluminum plate and then drying or a method comprising the steps of dipping the hydrophilized aluminum plate in a solution of the foregoing compound dissolved in water, an organic solvent such as methanol, ethanol, methyl ethyl ketone or a mixture thereof to adsorb the compound on the plate, then washing with, for instance, water and drying. In the former, a coating solution containing the compound in a concentration ranging from 0.005 to 10% by weight can be applied by a variety of methods such as coating with a bar coater, whirler and spray or curtain coating, while in the latter method, the concentration of the solution ranges from 0.01 to 20% by weight, preferably 0.05 to 5% by weight and the dipping temperature ranges from 20° to 90° C., preferably 25° to 50° C. and the dipping time ranges from 0.1 second to 20 minutes, preferably 2 seconds to one minute.

The pH value of the solutions herein used may be adjusted to 1 to 12 with basic substances such as ammonia, triethylamine and potassium hydroxide or an acidic substances such as hydrochloric acid or phosphoric acid. Moreover, a yellow dye can be added for the improvement of tone reproduction of the PS plates.

The coated amount (weighed after drying) of the organic underlying layer suitably ranges from 2 to 200 mg/m$^2$, preferably 5 to 100 mg/m$^2$. This is because, if the coated amount is less than 2 mg/m$^2$, the printing durability of the resulting lithographic printing plate is insufficient, while if it exceeds 200 mg/m$^2$, sufficient printing durability cannot likewise be obtained.

Back Coat Layer

A coating layer of an organic polymer (hereinafter referred to as "back coat layer") may be applied onto the back face of the PS plate of the present invention to prevent the occurrence of defects upon handling the PS plates while putting them in layers. Materials for the back coat layer are organic polymers having a glass transition point of not less than 20° C., preferably not less than 30° C. and preferably insoluble in water and alkaline developers having a pH of not less than 8.5. This is because if an organic polymer having a glass transition point of less than 20° C. is used, the resulting back coat layer is adhered to the photosensitive layer when a plurality of PS plates are handled while putting them in piles.

Preferred examples thereof are polybutadienes, saturated polyester resins, unsaturated polyester resins, polyamides, polyurethanes, polyureas, polyimides, polysiloxanes, polycarbonates, epoxy resins, phenoxy resins, chlorinated polyethylenes, condensed alkylphenol/aldehyde resins, acetal resins, polyvinyl chlorides, polyvinylidene chlorides, polystyrenes, acrylic resins including copolymers, hydroxycelluloses, polyvinyl alcohols, cellulose acetates and carboxymethyl celluloses. The glass transition points of these organic polymers can be controlled to not less than 20° C. by appropriately selecting the degree of polymerization and monomer moieties of the copolymers or by hardening with a proper crosslinking agent.

Particularly preferred principal component of the back coat layer used in the present invention is at least one member selected from the group consisting of saturated copolymerized polyester resins, phenoxy resins, polyvinyl acetal resins and vinylidene chloride copolymer resins having glass transition points of not less than 20° C.

The saturated copolymerized polyester resin comprises dicarboxylic acid units and diol units. Examples of dicarboxylic acids as the dicarboxylic acid units of the polyesters are aromatic dicarboxylic acids such as phthalic acid, terephthalic acid, isophthalic acid, tetrabromophthalic acid and tetrachlorophthalic acid; and saturated aliphatic dicarboxylic acids such as adipic acid, azelaic acid, succinic acid, oxalic acid, suberic acid, sebacic acid, malonic acid and 1,4-cyclohexane dicarboxylic acid.

Examples of the diol units for the polyesters include aliphatic chain diols such as ethylene glycol, diethylene glycol, triethylene glycol, polyethylene glycol, propylene glycol, dipropylene glycol, polypropylene glycol, 1,3-butylene glycol, 2,3-butylene glycol, 1,4-butylene glycol, neopentyl glycol, hexanediol and 2,2,4-trimethyl-1,3-pentanediol; and cyclic diols such as 1,4-bis- β-hydroxyethoxy cyclohexane, cyclohexane dimethanol, tricyclodecane dimethanol, bisphenoldioxy ethyl ether and bisphenoldioxy propyl ether. At least one dicarboxylic acid unit and at least one diol unit are used and at least two of either the dicarboxylic acid or diol units are used as copolymerizable units. Properties of the resulting copolymer are determined by the composition and molecular weight of the copolymer. The back coat layer used in the present invention can preferably be applied by pressing a film under heat or by a melt-lamination method, but more preferably the back coat layer is formed by applying a solution of these components from the viewpoint of the formation of a desired thin film. For this reason, preferred copolymer polyester resins used in the invention are amorphous ones easily soluble in various organic solvents industrially used.

The molecular weight of the copolymerized polyester resin is preferably not less than 10,000 from the viewpoint of the film strength of the resulting back coat layer.

Materials for the back coat layer usable in the invention are further include, for instance, phenoxy resins, polyvinyl acetal resins and vinylidene chloride copolymerized resins having glass transition points of not less than 20° C.

The phenoxy resins usable in the invention are produced from bisphenol A and epichlorohydrin like epoxy resins, but the phenoxy resins have high resistance to chemicals and good adhesion without using auxiliary agents such as a hardening agent and a catalyst unlike the epoxy resins and, therefore, are preferably used as principal components for the back coat layer.

Polyvinyl acetals are resins obtained by modifying polyvinyl alcohols with aldehydes such as butyl aldehyde and formaldehyde and preferred are, for instance, polyvinyl butyral resins and polyvinyl formal resins. The physical and chemical properties of these acetal resins vary depending on the degree of modification with acetal, the compositional ratios of hydroxyl and acetyl groups and the degree of polymerization. Preferred back coat layer is formed from an acetal resin having a degree of modification with acetal of not less than 60 mole %, a degree of polymerization of not less than 300.

Examples of vinylidene chloride copolymer resins are copolymer resins of vinylidene chloride monomer with vinyl monomers such as vinyl chloride, vinyl acetate, ethylene and vinyl methyl ether; and acrylic monomers such as (meth)acrylates and (meth)acrylonitriles), with vinylidene chloride copolymers comprising at most 20 mole % of acrylonitrile being preferred because of high solubility in organic solvents for general purposes.

The resins used as materials for the back coat layer of the invention have glass transition points of not less than 20° C. and preferably not less than 30° C. and are insoluble in water and alkaline developers having pH of not less than 8.5. If a resin having a glass transition point of less than 20° C. is used, the resulting back coat layer suffers from the problem of adhesion.

Other preferred materials for the back coat layer of the invention further include copolymers generally having a molecular weight of 10,000 to 200,000 and having structural units derived from the following monomers (1) to (12). The glass transition points thereof can likewise be controlled to desired values by properly selecting the degree of polymerization and monomers to be copolymerized.

(1) (Meth)acrylamides, (meth)acrylic acid esters and hydroxystyrenes having an aromatic hydroxy group such as N-(4-hydroxyphenyl) (meth)acrylamide, o-, m- or p-hydroxystyrene and o-, m- or p-hydroxyphenyl-(meth)acrylate.

(2) (Meth)acrylic acid esters having an aliphatic hydroxy group such as 2-hydroxyethyl (meth)acrylate.

(3) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl-acrylate and N-dimethylaminoethyl acrylate.

(4) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate.

(5) (Meth)acrylamides such as (meth)acrylamide, N-methylol (meth)acrylamide, N-ethyl (meth)acrylamide, N-hexyl (meth) acrylamide, N-cyclohexyl (meth)acrylamide, N-hydroxyethyl (meth)acrylamide, N-phenyl (meth)acrylamide, N-benzyl (meth) acrylamide, N-nitrophenyl (meth)acrylamide and N-ethyl-N-phenyl (meth)acrylamide.

(6) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(7) Vinyl esters such as vinyl acetate, vinyl chloroacetate, vinyl butyrate and vinyl benzoate.

(8) Styrenes such as styrene, methylstyrene and chloromethylstyrene.

(9) Vinyl ketones such as methyl vinyl ketone, ethyl vinyl ketone, propyl vinyl ketone and phenyl vinyl ketone.

(10) Olefins such as ethylene, propylene, isobutylene, butadiene and isoprene.

(11) N-vinyl pyrrolidone, N-vinyl carbazole, 4-vinyl pyridine, acrylonitrile and methacrylonitrile.

(12) Unsaturated sulfonamides of (meth)acrylamides such as N-(o-aminosulfonylphenyl) (meth)acrylamide, N-(m-a minosulfonylphenyl) (meth)acrylamide, N-(p-aminosulfonylphenyl) (meth)acrylamide, N-(1-(3-aminosulfonyl)naphthyl) (meth) acrylamide and N-(2-aminosulfonylethyl) (meth)acrylamide; and unsaturated sulfonamides of (meth)acrylic acid esters such as o-aminosulfonylphenyl (meth)acrylate, m-aminosulfonylphenyl (meth) acrylate, p-aminosulfonylphenyl (meth)acrylate and 1-( 3-aminosulfonylnaphthyl) (meth)acrylate.

Further, the foregoing monomers may likewise be copolymerized with other monomers copolymerizable therewith and the copolymers of the monomers listed above can be modified with, for instance, glycidyl (meth)acrylate. However, the copolymers usable in the invention are not limited to these specific examples.

The back coat layer used in the invention may optionally comprise, in addition to these organic polymers, a plasticizer, a surfactant and/or other additives for imparting flexibility to the back coat layer and for controlling the slip characteristics thereof.

Preferred plasticizers usable in the invention include phthalates such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate and diallyl phthalate; glycol esters such as dimethyl glycol phthalate, ethylphthalyl ethyl glycolate, methylphthalyl ethyl glycolate, butylphthalyl butyl glycolate and triethylene glycol dicaprylate; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetate and butyl laurate.

These plasticizers may be added to the back coat layer in such an amount that the glass point of the layer is not reduced to less than 20° C. and is in general up to 30% by weight on the basis of the weight of the resin used.

The back coat layer used in the invention may further comprise a surfactant for improving, for instance, the slip characteristics of the back coat layer, the surface condition of the coated film and the adhesion thereof to a substrate. Surfactants usable herein are anionic, cationic, nonionic and amphoteric ones.

Examples of surfactants preferably used are nonionic surfactants such as polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-modified castor oils, polyoxyethylene glycerin fatty acid partial esters, fatty acid diethanolamides, N,N-bis-2-hydroxyalkylamines, polyoxyethylene alkylamines, triethanolamine fatty acid esters and trialkylamine oxides; anionic surfactants such as fatty acid salts, abietic acid salts, hydroxyalkanesulfonic acid salts, alkanesulfonic acid salts, salts of dialkylsulfosuccinic acid esters, linear alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, sodium salt of N-methyl-N-oleyltaurine, disodium salts of N-alkylsulfosuccinic acid monoamides, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially saponified products of styrene/maleic anhydride copolymers, partially saponified products of olefin/maleic anhydride copolymers and naphthalenesulfonic acid salts/formalin condensates; cationic surfactants such as alkylamine salts, quaternary ammonium salts, polyoxyethylene alkylamine salts and polyethylene polyamine derivatives; amphoteric surfactants such as carboxy betaines, aminocarboxylic acids, sulfobetaines, aminosulfuric acid esters and imidazolines. The "polyoxyethylene" moiety of the foregoing surfactants can be replaced with polyoxyalkylene moieties such as polyoxymethylene, polyoxypropylene and polyoxybutylene and these surfactants can also be used in the present invention.

Examples of other surfactants preferably used are fluorine atom-containing ones having, in the molecules, perfluoroalkyl groups. Specific examples thereof include anionic type ones such as perfluoroalkylcarboxylic acid salts, perfluoroalkyl-sulfonic acid salts and perfluoroalkylphosphoric acid esters; amphoteric type ones such as perfluoroalkyl betaines; cationic type ones such as perfluoroalkyl trimethylammonium salts; and nonionic type ones such as perfluoroalkylamine oxides, perfluoroalkyl ethylene oxide adducts, oligomers carrying perfluoroalkyl groups and hydrophilic groups, oligomers carrying perfluoroalkyl groups and lipophilic groups, oligomers carrying perfluoroalkyl groups, hydrophilic groups and lipophilic groups and urethanes carrying perfluoroalkyl groups and lipophilic groups.

The foregoing surfactants may be used alone or in combination and the amount thereof added to the back coat layer preferably ranges from 0.001 to 10% by weight and more preferably 0.01 to 5% by weight.

The back coat layer used in the invention may further comprise, for instance, dyes or pigments for coloring the layer, silane coupling agents, diazo resins comprising diazonium salts, organophosphonic acids, organophosphoric acids and cationic polymers for improving the adhesion to a substrate, and waxes, higher fatty acids, higher fatty acid amides, silicon compounds comprising dimethylsiloxane, modified dimethylsiloxanes and polyethylene powder commonly used as lubricants, in proper amounts.

The thickness of the back coat layer is not restricted to a specific range so far as it is sufficient to prevent the formation of scratches on the photosensitive layer and preferably ranges from 0.01 to 8 µm. This is because if it is less than 0.01 µm, the formation of scratches on the photosensitive layer cannot be prevented upon handling the PS plates while putting them in piles. On the other hand, if it exceeds 8 µm, the resulting back coat layer is dissolved in or swollen with agents used during printing to thus cause change in the thickness of the layer. This leads to the change of the printing pressure and hence to the deterioration of printing properties thereof.

The back coat layer can be applied onto the back face of a substrate according to various methods. Examples thereof include a method comprising forming the foregoing components into a film and adhering the film to an aluminum substrate with an adhesive or by applying heat and a method comprising forming the components into a molten film with a melt-extruder and simultaneously adhering the molten film to a substrate, but it is preferred to use a method comprising preparing a solution of the foregoing components, applying the solution to the surface of a substrate and then drying since this method ensures the formation of a layer of a desired coated amount (or thickness) defined above. Solvents used in this method are, for instance, organic solvents disclosed in J. P. KOKAI No. Sho 62-251739 which may be used alone or in combination.
Photosensitive Layer A photosensitive layer comprising a known photosensitive composition is formed on the aluminum plate having a hydrophilic surface thus obtained to give a PS plate. Examples of photosensitive compositions usable in the invention include positive-working photosensitive compositions comprising, as principal components, o-quinonediazide compounds and negative-working compositions comprising, for instance, p hotopolymerizable compounds which mainly comprise diazonium salts, alkali-soluble diazonium salts or unsaturated double bond-containing monomers or cinnamic acid and dimethylmaleimido group-containing photo-crosslinkable compounds, as photosensitive substances.
Positive-Working Photosensitive Layer Examples of the principal component of the positive-working photosensitive composition are o-naphthoquinonediazide compounds. Preferred o-naphthoquinonediazide compounds are esters of 1,2-diazonaphthoquinonesulfonic acid with pyrogallol-acetone resin as disclosed in J. P. KOKOKU No. Sho 43-28403 (U.S. Pat. No. 3,635,709). Other preferred o-quinonediazide compounds are, for instance, esters of 1,2-diazonaphthoquinone-5-sulfonic acid with phenol-formaldehyde resin as disclosed in U.S. Pat. Nos. 3,046,120 and 3,188,210; and esters of 1,2-diazonaphthoquinone-4-sulfonic acid with phenol-formaldehyde resin as disclosed in J. P. KOKAI Nos. Hei 2-96163, Hei 2-96165 and Hei 2-96761. Examples of other preferred o-n aphthoquinonediazide compounds include those known and disclosed in a variety of patents such as J. P. KOKAI Nos. Sho 47-5303, Sho 48-63802, Sho 48-63803, Sho 48-96575, Sho 49-38701 and Sho 48- 13854, J. P. KOKOKU Nos. Sho 37-18015, Sho 41-11222, Sho 45-9610 and Sho 49-17481, U.S. Pat. Nos. 2,797,213; 3,454,400; 3,544,323; 3,573,917; 3,674,495 and 3,785,825; U.K. Patent Nos. 1,227,602; 1,251,345; 1,267,005; 1,329,888 and 1,330,932; and German Patent No. 854,890.

Particularly preferred o-naphthoquinonediazide compounds are those obtained through the reaction of polyhydroxy compounds having molecular weight of not more than 1,000 with 1,2-diazonaphthoquinonesulfonic acid. Specific examples thereof are those disclosed in, for instance, J. P. KOKAI Nos. Sho 51- 139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047; and U.S. Pat. Nos. 3,102,809; 3,126,281; 3,130,047; 3,148,983; 3,184,310; 3,188,210 and 4,639,406.

These o-naphthoquinonediazide compounds are preferably obtained by reacting polyhydroxy compounds with 1,2-diazonaphthoquinonesulfonic acid chloride in an amount ranging from 0.2 to 1.2 eq, more preferably 0.3 to 1.0 eq. The 1,2-diazonaphthoquinonesulfonic acid chloride may be either 1,2-diazonaphthoquinone-5-sulfonic acid chloride or 1,2-diazonaphthoquinone-4-sulfonic acid chloride.

In this respect, the resulting o-naphthoquinonediazide compound is a mixture of products variously differing in the positions of 1,2-diazonaphthoquinonesulfonate groups and the amounts thereof introduced, but preferred are those having a rate of the compound whose hydroxyl groups are all converted into 1,2-diazonaphthoquinonesulfonic acid esters (content of the completely esterified compound) of not less than 5 mole %, more preferably 20 to 99 mole %.

The photosensitive composition used in the invention preferably comprises the positive-working photosensitive compounds (inclusive of the foregoing combination) in an amount suitably ranging from 10 to 50% by weight and more preferably 15 to 40% by weight.

Binders for Positive-Working Photosensitive Composition

The positive-working photosensitive composition may comprise only o-quinonediazide compounds such as those listed above, but preferebly the o-quinonediazide compounds are used in combination with an alkaline water-soluble resin as a binder. Preferred examples thereof are alkaline water-soluble novolak resins such as phenol-formaldehyde resins and cresol-formaldehyde resins, for instance, o-, m- and p-cresol-formaldehyde resins, m-/p-mixed cresol-formaldehyde resins and phenol-mixed cresol (m-/p-/o- or m-/p- or m-/o-)-formaldehyde resins.

Other binders usable in the invention further include phenol-modified xylene resins, polyhydroxystyrenes, halogenated polyhydroxystyrenes and acrylic resins having phenolic hydroxyl groups as disclosed in J. P. KOKAI No. Sho 51-34711. Examples of suitable binders may further include copolymers generally having a molecular weight of 10,000 to 200,000 and having structural units derived from the following monomers (1) to (13).

(1) (Meth)acrylamides, (meth)acrylic acid esters and hydroxystyrenes having an aromatic hydroxy group such as N-(4hydroxyphenyl) (meth)acrylamide, o-, m- or p-hydroxystyrene and o-, m- or p-hydroxyphenyl-(meth)acrylate.
(2) (Meth)acrylic acid esters having an aliphatic hydroxy group such as 2-hydroxyethyl (meth)acrylate.
(3) Unsaturated carboxylic adids such as (meth)acrylic acid, maleic anhydride and itaconic acid.
(4) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate.
(5) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate.
(6) (Meth)acrylamides such as (meth)acrylamide, N-methylol (meth)acrylamide, N-ethyl (meth)acrylamide, N-hexyl (meth) acrylamide, N-cyclohexyl (meth)acrylamide, N-hydroxyethyl (meth)acrylamide, N-phenyl (meth)acrylamide, N-benzyl (meth) acrylamide, N-nitrophenyl (meth)acrylamide and N-ethyl-N-phenyl (meth)acrylamide.
(7) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.
(8) Vinyl esters such as vinyl acetate, vinyl chloroacetate, vinyl butyrate and vinyl benzoate.
(9) Styrenes such as styrene, methylstyrene and chloromethylstyrene.
(10) Vinyl ketones such as methyl vinyl ketone, ethyl vinyl ketone, propyl vinyl ketone and phenyl vinyl ketone.
(11) Olefins such as ethylene, propylene, isobutylene, butadiene and isoprene.
(12) N-vinyl pyrrolidone, N-vinyl carbazole, 4-vinyl pyridine, acrylonitrile and methacrylonitrile.
(13) Unsaturated sulfonamides of (meth)acrylamides such as N-(o-aminosulfonylphenyl) (meth)acrylamide, N-(m-a minosulfonylphenyl) (meth)acrylamide, N-(p-aminosulfonylphenyl) (meth)acrylamide, N-(1-(3-aminosulfonyl-)naphthyl) (meth) acrylamide and N-(2-aminosulfonylethyl) (meth)acrylamide; and unsaturated sulfonamides of (meth)acrylic acid esters such as o-aminosulfonylphenyl (meth)acrylate, m-aminosulfonylphenyl (meth) acrylate, p-aminosulfonylphenyl (meth)acrylate and 1-(3-aminosulfonylnaphthyl) (meth)acrylate.

Further, the foregoing monomers may likewise be copolymerized with other monomers copolymerizable therewith and the copolymers of the monomers listed above can be modified with, for instance, glycidyl (meth)acrylate. However, the copolymers usable in the invention are not limited to these specific examples.

The foregoing copolymers preferably comprise moieties derived from the unsaturated carboxylic acids (3) listed above and the acid value thereof preferably ranges from 0 to 10 meq/g, more preferably 0.2 to 5.0 meq/g. Moreover, the preferred molecular weight of these copolymers ranges from 10,000 to 100,000. The copolymers, if desired, may comprise polyvinyl butyral resin, polyurethane resin, polyamide resin and/or epoxy resin.

These alkali-soluble polymers may be used alone or in combination and the amount thereof is not more than 80% by weight on the basis of the total weight of the photosensitive composition.

The light-sensitive composition used in the invention preferably comprises, for the improvement of the ink receptivity of images, phenol/formaldehyde condensates carrying alkyl groups having 3 to 8 carbon atoms (e.g., t-butylphenol/formaldehyde resin and octylphenol/formaldehyde resin as substituents as disclosed in U.S. Pat. No. 4,123,279 and, for the improvement of sensitivity, cyclic acid anhydrides, phenols and/or organic acids. Examples of such cyclic acid anhydrides are phthalic anhydride, tetrahydro-phthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride. Such phenols include, for instance, bisphenol A, p-nitrophenol, p-ethoxyphenol, 2,3,4-trihydroxybenzophenone, 4-hydroxy-benzophenone, 2,4,4'-trihydroxybenzophenone, 4,4',4''-trihydroxy-triphenylmethane and 4,4',3'',4''-tetrahydroxy-3,5,3',5'-tetramet hyltriphenylmethane. Such organic acids are, for instance, sulfonic acids, sulfinic acids, alkylsulfuric acids, phosphonic acids, phosphinic acids, phosphoric acid esters and carboxylic acids as disclosed in J. P. KOKAI Nos. Sho 60-88942 and Hei 2- 96755 and specific examples thereof are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid.

The content of the foregoing cyclic acid anhydrides, phenols and/or organic acids in the photosensitive composition preferably ranges from 0.05 to 15% by weight and more preferably 0.1 to 5% by weight.

The composition used in the invention may further comprise, for extending the development latitude, non-ionic surfactants as disclosed in J. P. KOKAI Nos. Sho 62-251740 and Hei 4-68355 and/or amphoteric surfactants as disclosed in J. P. KOKAI No. Sho 59-121044 and Hei 4-13149. Specific examples of non-ionic surfactants are sorbitan tristearate, sorbitan monopalmitate, sorbitan trioleate, stearyl monoglyceride, polyoxyethylene sorbitan monooleate and polyoxyethylene nonylphenyl ether and examples of amphoteric surfactants are alkyl di(aminoethyl) glycine, alkyl polyaminoethyl glycine hydrochloride, 2-alkyl-N-carboxyethyl-N-hydroxyethyl imidazolinium betaine and Amorgen K (trade name of an N-tetradecyl-N, N-betaine type surfactant, available from Dai-Ichi Kogyo Seiyaku Co., Ltd.) and Rebon 15 (trade name of an alkyl imidazoline type one available from Sanyo Chemical Industries, Ltd.).

The content of the foregoing non-ionic and/or amphoteric surfactants in the composition ranges from 0.05 to 15% by weight and more preferably 0.1 to 5% by weight.

The positive-working photosensitive composition used in the invention may comprise a printing out agent for obtaining a visible image immediately after exposure to light and a dye or pigment for coloring images. A representative example of the printing out agent is a combination of a photosensitive compound capable of releasing an acid through exposure to light with a salt-forming organic dye, for instance, a combination of o-naphthoquinonediazido-4-sulfonic acid halide with a salt-forming organic dye as disclosed in J. P. KOKAI Nos. Sho 50-36209 (=U.S. Pat. No. 3,969,118) and Sho 53-8128; and a combination of a trihalomethyl compound with a salt-forming organic dye as disclosed in J. P. KOKAI Nos. Sho 53-36223 (=U.S. Pat. No. 4,160,671), Sho 54-74728 (=U.S. Pat. No. 4,232,106), Sho 60-3626, Sho 60-138539, Sho 61-143748, Sho 61-151644 and Sho 63-58440 (=U.S. Pat. No. 5,064,741). Such trihalomethyl compounds include oxadiazole and triazine type compounds and both of these are excellent in stability with time and can provide clear printed out images.

Other dyes may also be used instead of or together with the foregoing salt-forming organic dyes as the agents for coloring images. Preferred dyes inclusive of the salt-forming organic dyes are, for instance, oil-soluble and basic dyes. Specific examples thereof are Oil Yellow #101 and #103, Oil Pink #312, Oil Green BG, Oil Blue BOS and #603, Oil Black BY, BS and T-505 (they are all available from Orient Chemical Industries, Co., Ltd.), Victoria Pure Blue, Crystal Violet (CI 42555), Methyl Violet (CI 42535), Ethyl Violet, Rhodamine B (CI 145170B), Malachite Green (CI 42000) and Methylene Blue (CI 52015). Particularly preferred are those disclosed in J. P. KOKAI No. Sho 62-293247 (=GB 2192729).

The positive-working photosensitive composition is dissolved and dispersed in a solvent capable of dissolving the foregoing components and then applied onto an aluminum substrate. Examples of solvents used herein include organic solvents disclosed in J. P. KOKAI No. Sho 62-251739 which may be used alone or in combination. The photosensitive composition is dissolved and dispersed in such a solvent in a concentration ranging from 2 to 50% by weight (solid content), applied to the support and then dried. The coated amount of the positive-working photosensitive composition layer (photosensitive layer) applied onto the support varies depending on the applications of the resulting plate, but preferably ranges from 0.3 to 4.0 g/m$^2$ (weighed after drying). As the coated amount decreases, the quantity of light for imagewise exposure is reduced, but the strength of the resulting layer is lowered. On the other hand, as it is increased, the quantity of light for imagewise exposure increases, but the strength of the photosensitive layer increases and, for instance, if it is used as a PS plate, a lithographic printing plate capable of providing a large number of copies (high printing durability) can be obtained.

The positive-working photosensitive composition may comprise a surfactant such as a fluorine atom-containing surfactant as disclosed in J. P. KOKAI No. Sho 62-170950 (=U.S. Pat. No. 4,822,713) for improving the coating properties thereof. The amount thereof to be added preferably ranges from 0.001 to 1. 0% by weight, more preferably 0.005 to 0.5% by weight on the basis of the total weight of the composition.

Negative-Working Photosensitive Composition

Examples of negative-working photosensitive composition used for negative-working PS plate to which the back coat layer of the invention is applied are photosensitive compositions comprising photosensitive diazo compounds, photopolymerizable photosensitive compositions and photocrosslinkable photosensitive composition. Among these, photohardenable photosensitive compositions will be detailed below by way of example.

The photosensitive diazo compounds used in the PS plate of the invention are, for instance, diazo resins obtained through condensation of aromatic diazonium salts with reactive carbonyl group-containing organic condensation agents, in particular, aldehydes such as formaldehyde and acetaldehyde or acetals in acidic mediums, with a condensate of p-diazodiphenylamine with formaldehyde being the most typical example thereof. Methods for synthesizing these diazo resins are detailed in, for instance, U.S. Pat. Nos. 2,679,498; 3,050,502; 3,311,605 and 3,277,074.

Preferred photosensitive diazo compounds further include, for instance, co-condensed diazo compounds of aromatic diazonium salts with substituted aromatic compounds free of diazonium groups as disclosed in J. P. KOKOKU No. Sho 49-48001 and among these, particularly prefered are co-condensed diazo compounds of aromatic diazonium salts with aromatic compounds substituted with alkali-soluble groups such as carboxyl and hydroxyl groups.

Moreover, preferred compounds further include, for instance, photosensitive diazo compounds obtained by condensing aromatic diazonium compounds with reactive carbonyl compounds carrying alkali-soluble groups as disclosed in J. P. A. Nos. Hei 1-130493, Hei 2-321823 and Hei 2-299551.

There have been known diazo resins in which the counteranions of these diazonium salts are inorganic anions such as those derived from mineral acids, e.g., hydrochloric acid, hydrobromic acid, sulfuric acid and phosphoric acid or complex salts thereof with zinc chloride. However, particularly preferred are diazo resins which are substantially insoluble in water and soluble in organic solvents. Such preferred diazo resins are detailed in J. P. KOKOKU No. Sho 47-1167 and U.S. Pat. No. 3,300,309.

Moreover, preferred diazo resins further include, for instance, those having counteranions derived from halogenated Lewis acids such as tetrafluoroboric acid, hexafluorophosphoric acid and perhalogenic acids such as perchloric acid and periodic acid as disclosed in J. P. KOKAI Nos. Sho 54-98613 and Sho 56-121031. In addition, preferred are also include diazo resins having counteranions derived from sulfonic acid carrying long chain alkyl groups as disclosed in J. P. KOKAI Nos. Sho 58- 209733, Sho 62-175731 and Sho 63-262643.

The amount of the photosensitive diazo compounds usually ranges from 5 to 50% by weight and preferably 8 to 20% by weight on the basis of the total weight of the photosensitive layer.

Binders Used in Negative-Working Photosensitive Composition

The photosensitive diazo compounds used in the invention are preferably used in combination with alkaline water-soluble or swellable lipophilic polymer materials as binders. Examples of such lipophilic polymeric compounds are the same copolymers listed above in connection with the positive-working photosensitive copying materials and having repeating units derived from the monomers (1) to (13) and molecular weights generally ranging from 10,000 to 200,000 as well as those having repeating units derived from the following monomers (14) and (15):

(14) unsaturated imides such as maleimide, N-acryloyl-(meth) acrylamide, N-acetyl(meth)acrylamide, N-propionyl(meth) acrylamide and N-(p-chlorobenzoyl) (meth)acrylamide.

(15) unsaturated monomers having, on the side chains, crosslinkable groups such as N-(2-((meth)acryloyloxy-)ethyl)- 2,3-dimethylmaleimide and vinyl cinnamate.

Further, other monomers copolymerizable with the foregoing monomers may be copolymerized. Moreover, the binders also include copolymers obtained by copolymerization of the foregoing monomers which are further modified with glycidyl (meth)acrylate. However, the present invention is not restricted to these specific binders.

The foregoing copolymers preferably comprise moieties derived from the unsaturated carboxylic acids (3) listed above and the acid value thereof preferably ranges from 0 to 10 meq/g, more the preferably 0.2 to 5.0 meq/g. Moreover, preferred molecular weight of these copolymers ranges from 10,000 to 100,000. The copolymers, if desired, may comprise polyvinyl butyral resin, polyurethane resin, polyamide resin and/or epoxy resin.

Other preferred binders are novolak type resins such as phenol/formaldehyde resin, o-, m- and p-cresol/formaldehyde resins, m-/p-mixed cresol/formaldehyde resins and phenol/cresol (o-/m-/p-, m-/p- or o-/m-mixed cresol)/formaldehyde resins. Moreover, usable binders further include, for instance, phenol-modified xylene resins, polyhydroxystyrene, halogenated polyhydroxystyrene and alkali-soluble resins having phenolic hydroxyl groups as disclosed in J. P. KOKAI No. Sho 51-34711.

These alkali-soluble polymers may be used alone or in combination and the amount thereof ranges from 40 to 95% by weight based on the total weight of the solid contents of the photosensitive composition.

The photosensitive composition used in the invention may optionally comprises an agent for improving the ink receptivity of images such as styrene/maleic anhydride copolymers half-esterified with alcohols, novolak resins and 50% fatty acid esters of p-hydroxystyrene as disclosed in J. P. KOKAI No. Sho 55-527.

The negative-working photosensitive composition used in the invention may optionally comprise a plasticizer for improving the flexibility and wear resistance of the resulting coating layer. Specific examples thereof are butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of (meth) acrylic acid, with tricresyl phosphate being particularly preferred.

The negative-working photosensitive composition used in the invention may comprise, for the improvement of stability with time, additives such as phosphoric acid, phosphonic acid, citric acid, oxalic acid, dipicolinic acid, benzenesulfonic acid, naphthalenesulfonic acid, sulfosalicylic acid, 4-methoxy- 2-hydroxybenzophenone-5-sulfonic acid and tartric acid.

The negative-working photosensitive composition used in the invention may comprise printing out agent for obtaining a visible image immediately after imagewise exposure to light and/or agents for coloring images such as dyes or pigments.

Representative printing out agents are combinations of compounds releasing acids through exposure to light (photolytically acid-releasing agents) with salt-forming organic dyes. Specific examples thereof are combinations of trihalomethyl compounds with salt-forming organic dyes as disclosed in J. P. KOKAI Nos. Sho 53-36223 (=U.S. Pat. No. 4,160,671), Sho 54-74728 (=U.S. Pat. No. 4,232,106), Sho 60-3626, Sho 61-143748, Sho 61-151644 and Sho 63-58440 (=U.S. Pat. No. 5,064,741). Such trihalomethyl compounds include oxazole and triazine type compounds and both of these are excellent in stability with time and can provide clear printed out images.

The dyes are preferably those which change color tone through the reaction with free radicals or acids. Specific examples thereof which are initially colored and converted into colorless ones, or which cause color change are triphenylmethane, diphenylmethane, oxazine, xanthene, iminonaphthoquinone, azomethine or anthraquinone type dyes such as oil-soluble and basic dyes. Specific examples thereof are Victoria Pure Blue (available from Hodogaya Chemical Co., Ltd.), Oil Yellow #101 and #103, Oil Pink #312, Oil Red, Oil Green BG, Oil Blue BOS and #603, Oil Black BY, BS and T-505 (they are all available from Orient Chemical Industries, Co., Ltd.), Patent Pure Blue (available from Sumitomo Mikuni Chemical Co., Ltd.), Crystal Violet (CI 42555), Methyl Violet (CI 42535), Ethyl Violet, Rhodamine B (CI 145170B), Malachite Green (CI 42000), Methylene Blue (CI 52015), Brilliant Blue, Methyl Green, Erythrosine B, Basic Fuchsine, m-Cresol Purple, Auramine, 4-p-diethylaminophenyl iminonaphthoquinone, cyano-p-diethylaminophenyl acetanilide.

On the other hand, examples of dyes which are initially colorless and converted into colored ones are leuco dyes and primary and secondary arylamine type dyes such as triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o-methyltriphenylmethane, p,p'-bis-dimethylaminodiphenyl-4-anilinonaphthylmethane and p,p',p"-triaminotriphenylmethane.

Preferred are triphenylmethane and diphenylmethane type ones, more preferred are triphenylmethane type dyes, in particular Victoria Pure Blue BOH. The foregoing dyes are used in an amount preferably ranging from about 0.5 to 10% by weight, more preferably about 1 to 5% by weight based on the total weight of the negative-working photosensitive composition.

The negative-working photosensitive composition used in the invention may comprise cyclic acid anhydrides, phenols, organic acids and/or higher alcohols for the improvement of the developability of the resulting photosensitive layer. These additives are the same as those listed above in connection with the positive-working photosensitive composition and used in the same amount defined above.

The negative-working photosensitive composition is dissolved in a solvent in which the foregoing components are soluble and then applied onto the aluminum support. Examples of such solvents used herein are preferably those disclosed in, for instance, J. P. KOKAI Nos. Sho 62-251739 which may be used alone or in combination.

The negative-working photosensitive composition is dissolved or dispersed in the solvent in a concentration ranging from 2 to 50% by weight (solid content), applied to the support and then dried. The coated amount of the layer of the negative-working photosensitive composition (photosensitive layer) applied onto the support varies depending on the applications of the resulting plates, but preferably ranges from 0.3 to 4.0 g/m² (weighed after drying). As the coated amount decreases, the quantity of light for imagewise exposure is reduced, but the strength of the resulting film is lowered. On the other hand, as it is increased, the quantity of light required for imagewise exposure increases, but the strength of the resulting film increases. For instance, if the photosensitive composition is used in the PS plate of the present invention, a lithographic printing plate capable of providing a large number of copies (high printing durability) can be obtained.

The negative-working photosensitive composition may comprise a surfactant for the improvement in the coating properties of the composition like the aforementioned positive-working photosensitive composition.

In the preparation of the PS plate of the invention, the back coat layer applied to the back face of a substrate and the photosensitive layer applied to the upper surface of the substrate may be formed in any order or may be formed simultaneously.

Mat Layer

A mat layer is preferably applied onto the surface of the photosensitive layer thus formed to reduce the time required for evacuation during contact exposure using a vacuum printing frame and to prevent the formation of an indistinct image during printing. Examples of such mat layers are disclosed in J. P. KOKAI No. Sho 50-125805 and J. P. KOKOKU Nos. Sho 57-6582 and Sho 61-28986. Alternatively, the mat layer can also be formed by heat-welding solid powder onto the surface of the photosensitive layer as disclosed in J. P. KOKOKU No. Sho 62-62337. Excellent intended effects of the present invention would be anticipated by the PS plate having a mat layer soluble in water and aqueous alkaline developers.

The average diameter of projected portions on the mat layer used in the invention is preferably not more than 100 μm. If the average diameter exceeds this upper limit, the contact area between the photosensitive layer and the back coat layer increases, the slip characteristics of the mat layer is lowered and accordingly both surfaces of the photosensitive layer and the back coat layer are liable to cause scratches when the PS plates are stored in piles. The average height of the mat layer is preferably not more than 10 μm and more preferably 2 to 8 μm. If it exceeds the upper limit, the formation of fine images becomes difficult, the density of highlight dots is reduced and accordingly, the tone reproduction is insufficient. On the other hand, if it is less than 2 μm, an indistinct image is formed during printing due to insufficient contact between the photosensitive layer and an original film under vacuum. The amount of the mat layer to be coated preferably ranges from 5 to 200 mg/m² and more preferably 20 to 150 mg/m². If the coated amount thereof is greater than the upper limit, the contact area between the photosensitive layer and the back coat layer increases and this becomes a cause of scratch-formation, while if it is less than the lower limit, the contact under vacuum becomes insufficient.

Development Treatment

The PS plate thus prepared is imagewise exposed, through an original transparency, to actinic light from a light source such as a carbon arc lamp, a mercury lamp, a xenon lamp, a tungsten lamp or a metal halide lamp.

Alkali aqueous solutions commonly known can be used as developers or replenishers for these PS plates. Examples of the alkaline agents used in the developer or replenisher composition used in the invention include inorganic alkaline agents such as sodium silicate, potassium silicate, sodium hydroxide, potassium hydroxide, lithium hydroxide, ammonium hydroxide, sodium tertiary phosphate, potassium tertiary phosphate, sodium secondary phosphate, potassium secondary phosphate, ammonium tertiary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate; and organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. In the invention, these alkaline agents may be employed alone or in combination.

Most preferred alkaline agents for use in developers for positive-working PS plates are silicates such as sodium silicate and potassium silicate. This is because the developing ability of the developer can be controlled, to some extent, by adjusting the ratio of the silicon oxide $SiO_2$ to the alkali metal oxide $M_2O$ which are components of the silicate (in general expressed in terms of the molar ratio: $[SiO_2]/[M_2O]$) and the concentration of the silicate. Examples of such developers are aqueous solutions of sodium silicate having a molar ratio: $[SiO_2]/[Na_2O]$ ranging from 1.0 to 1.5 and an $SiO_2$ content of 1 to 4% by weight as disclosed in J. P. KOKAI No. Sho 54-62004; and aqueous alkali metal silicate solutions having a ratio: $[SiO_2]/[M]$ of 0.5 to 0.75 (i.e., $[SiO_2]/[M_2O]$ of 1.0 to 1.5) and an $SiO_2$ content of 1 to 4% by weight and containing at least 20% of potassium on the basis of the total gram atoms of the alkali metals present in the developer as disclosed in J. P. KOKOKU No. Sho 57-7427.

When the PS plate is developed with an automatic developing machine, it has been known that many PS plates can be processed over a long time without exchanging the developer in the developing tank if an aqueous solution (replenisher) having an alkalinity higher than that of the developer is added to the developer. It is also preferred to adopt this replenishment in the present invention. For instance, there can preferably be used a method which comprises using an aqueous solution of sodium silicate having a molar ratio: $[SiO_2]/[Na_2O]$ ranging from 1.0 to 1.5 and an $SiO_2$ content of 1to 4% by weight as disclosed in J. P. KOKAI No. Sho 54-62004 as a developer and continuously or intermittently adding an aqueous solution of sodium silicate (replenisher) having a molar ratio: $[SiO_2]/[Na_2O]$ ranging from 0.5 to 1.5 in proportion to the amount of the positive-working PS plates processed; and a method which uses an aqueous alkali metal silicate solution having a ratio: $[SiO_2]/[M]$ of 0.5 to 0.75 (i.e., $[SiO_2]/[M_2O]$ of 1.0 to 1.5) and an $SiO_2$ content of 1 to 4% by weight as a developer and an aqueous alkali metal silicate solution having a ratio: $[SiO_2]/[M]$ of 0.25 to 0.75 (i.e., $[SiO_2]/[M_2O]$ of 0.5 to 1.5) as a replenisher, both developer and replenisher containing at least 20% of potassium on the basis of the total gram atoms of the alkali metals present in the developer, as disclosed in J. P. KOKOKU No. Sho 57-7427.

When using an alkali metal silicate solution as such a replenisher, the molar ratio: $[SiO_2]/[M_2O]$ thereof is preferably restricted to a low level in order to increase the activity of the replenisher and to reduce the running cost and the amount of waste liquor. However, it has been known that, as the activity thereof increases, the aluminum of the substrate of the PS plate is easily dissolved in the developer to form insolubles therein during development. The back coat layer of the PS plate of the invention can serve to prevent the dissolution of the aluminum from the back face of the substrate and thus the PS plate of the invention can preferably be processed even in a developer system to which a replenisher having a high activity is supplemented. A preferably used developer system comprises a highly active developer which is an aqueous solution of an alkali metal silicate having a molar ratio: $SiO_2/M_2O$ of 0.7 to 1.5 and an $SiO_2$ content of 1.0 to 4.0% by weight and a replenisher which comprises an aqueous solution of an alkali metal silicate having a molar ratio: $SiO_2/M_2O$ of 0.3 to 1.0 and an $SiO_2$ content of 0.5 to 4.0% by weight.

The developer and replenisher used for developing the positive- and negative-working PS plate of the invention may optionally comprise various kinds of surfactants and/or organic solvents for promoting and suppressing the development, for dispersing development scum and for enhancing the ink receptivity of images on the printing plate. Surfactants usable herein are anionic, cationic, nonionic and amphoteric ones.

Examples of surfactants preferably used are nonionic surfactants such as polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-modified castor oils, polyoxyethylene glycerin fatty acid partial esters, fatty acid diethanolamides, N,N-bis-2-hydroxyalkylamines, polyoxyethylene alkylamines, triethanolamine fatty acid esters and trialkylamine oxides; anionic surfactants such as fatty acid salts, abietic acid salts, hydroxyalkanesulfonic acid salts, alkanesulfonic acid salts, salts of dialkylsulfosuccinic acid esters, linear alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, sodium salt of N-methyl-N-oleyltaurine, disodium salts of N-alkylsulfosuccinic acid monoamides, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially saponified products of styrene/maleic anhydride copolymers, partially saponified products of olefin/maleic anhydride copolymers and naphthalenesulfonic acid salts/formalin condensates; cationic surfactants such as alkylamine salts, quaternary ammonium salts, polyoxyethylene alkylamine salts and polyethylene polyamine derivatives; amphoteric surfactants such as carboxy betaines, aminocarboxylic acids, sulfobetaines, aminosulfuric acid esters and imidazolines. The "polyoxyethylene" moiety of the foregoing surfactants can be replaced with polyoxyalkylene moieties such as polyoxymethylene, polyoxypropylene and polyoxybutylene and these surfactants can also be used in the present invention.

Examples of other surfactants preferably used are fluorine atom-containing ones having, in the molecules, perfluoroalkyl groups. Specific examples thereof include anionic type ones such as perfluoroalkylcarboxylic acid salts, perfluoroalkyl-sulfonic acid salts and perfluoroalkylphosphoric acid esters; amphoteric type ones such as perfluoroalkyl betaines; cationic type ones such as perfluoroalkyl trimethylammonium salts; and nonionic type ones such as perfluoroalkylamine oxides, perfluoroalkyl ethylene oxide adducts, oligomers carrying perfluoroalkyl groups and hydrophilic groups, oligomers carrying perfluoroalkyl groups and lipophilic groups, oligomers carrying perfluoroalkyl groups, hydrophilic groups and lipophilic groups and urethanes carrying perfluoroalkyl groups and lipophilic groups.

The foregoing surfactants may be used alone or in combination and the amount thereof added to the developer preferably ranges from 0.001 to 10% by weight and more preferably 0.01 to 5% by weight.

The organic solvents which may be added to the developer are preferably selected from those having solubility in water of not more than about 10% by weight, in particular not more than 5% by weight. Examples of the organic solvent include 1-phenylethanol, 2-phenylethanol, 3-phenylpropanol-1, 4-phenylbutanol-1, 4-phenylbutanol-2, 2-phenylbutanol-1, 2-phenoxyethanol 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, 3-methylcyclohexanol, N-phenyl ethanolamine and N-phenyl diethanolamine.

The amount of the organic solvents preferably ranges from 0.1 to 5% by weight with respect to the total weight of the developer practically employed. The amount of the organic solvent is closely related to that of the surfactant. More specifically, the amount of the surfactant should be increased with the increase in that of the organic solvent. This is because if the amount of the anionic surfactant is low and that of the organic solvent is great, the organic solvent is not completely solubilized in water and as a result, good developing properties of the composition cannot be ensured.

The developer and replenisher used in the invention may further comprise reducing agent for preventing the contamination of the resulting lithographic printing plate and this is particularly effective in the development of negative-working PS plates comprising photosensitive diazonium salts. Examples of reducing agents preferably used are organic reducing agents, for instance, phenolic compounds such as thiosalicylic acid, hydroquinone, menthol, methoxyquinone, resorcin and 2-methylresorcin; amine compounds such as phenylenediamine and phenyl hydrazine; and inorganic reducing agents such as sodium, potassium and ammonium salts of inorganic acids such as sulfinic acid, hydrosulfurous acid, phosphorous acid, hydrogenphosphorous acid, dihydrogenphosphorous acid, thiosulfuric acid and dithionous acid. Among these, those having a particularly excellent effect of preventing contamination are sulfites. These reducing agents are preferably used in an amount ranging from 0.05 to 5% by weight on the basis of the weight of the developer practically employed.

The developer and replenisher may also comprise organic carboxylic acids. Preferred are aliphatic and aromatic carboxylic acids having 6 to 20 carbon atoms. Specific examples of the aliphatic carboxylic acids are caproic acid, enanthylic acid, caprylic acid, lauric acid, myristic acid, palmitic acid and stearic acid with the alkanoic acids having 8 to 12 carbon atoms being particularly preferred. These aliphatic acids may be unsaturated having, in the carbon chain, double bonds or those having branched carbon chains.

Examples of the aromatic carboxylic acids are compounds having carboxyl groups on the aromatic rings such as benzene, naphthalene and anthracene rings, for instance, o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid, with the hydroxynaphthoic acids being particularly effective.

The foregoing aliphatic and aromatic carboxylic acids are preferably used in the form of sodium, potassium or ammonium salt for improving the solubility thereof in water. The amount of the organic carboxylic acids used in the developer is not restricted to a particular range. However, if they are used in an amount of less than 0.1% by weight, the desired effect thereof is not anticipated, while if they are used in an amount of more than 10% by weight, any further effect thereof is not anticipated and if other additives are simultaneously used, they interrupt the dissolution thereof. Therefore, the amount of the carboxylic acids preferably ranges from 0.1 to 10% by weight and more preferably 0.5 to 4% by weight on the basis of the total weight of the developer practically used.

The developer and replenisher used in the invention may optionally comprise currently known additives such as antifoaming agents, water softeners and/or organic boron compounds as disclosed in J. P. KOKOKU No. Hei 1-57895. Examples of water softeners include polyphosphoric acids and sodium, potassium and ammonium salts thereof; polyaminocarboxylic acids and salts thereof such as ethylenediaminetetraacetic acid, diethylenetriaminepentaacetic acid, triethylenet etraminehexaacetic acid, hydroxyethylethylenediaminetriacetic acid, nitrilotriacetic acid, 1,2-diaminocyclohexanetetraacetic acid and 1,3-diamino-2-propanoltetraacetic acid, and ammonium, potassium and sodium salts thereof; aminotri(methylenephosphonic acid), ethylenediaminetetra(methylenephosphonic acid), diethylenetriaminepenta(methylenephosphonic acid), triethyl-enetetraminehexa(methylenephosphonic acid), hydroxyethylethylenediaminetri(methylenephosphonic acid) and 1-hydroxyethane-1,1-diphosphonic acid, and ammonium, potassium and sodium salts thereof.

The optimum amount of the water softener varies depending on the chelating ability of a specific softener, the hardness and the amount of hard water used, but the amount thereof in general ranges from 0.01 to 5% by weight and preferably 0.01 to 0.5% by weight on the basis of the total weight of the developer practically used. If the amount of the softener is less than the lower limit, the desired effect cannot be anticipated, while if it exceeds the upper limit, images are adversely affected and cause color blinding or the like.

The balance of the developer and replenisher used in the invention is water, but they may optionally comprise other various additives commonly known in the art.

It is preferred to prepare the developer and replenisher in the form of stock solutions having contents of the components higher than those practically used and diluted prior to use from the viewpoint of transportation. In this case, the contents are preferably selected such that each component does not cause separation and precipitation.

The PS plate thus developed is in general subjected to post-treatments with washing-water, a rinsing solution containing, for instance, a surfactant and/or a desensitizing gum solution containing, for instance, gum arabic and starch derivatives. The PS plate can be subjected to any combination of these post-treatments.

Recently, there has been widely used an automatic developing machine for PS plates in the fields of plate-making and printing industries for rationalizing and standardizing the plate-making operations. This automatic developing machine in general comprises a developing zone and a post-treating zone and the developing zone comprises a device for transporting PS plates, tanks for accomodating processing solutions and a spray device. In this machine, a PS plate is developed by spraying each processing solution pumped up on the surface of the plate through a spray nozzle while continuously conveying the imagewise exposed plate. Recently, it has also been known a method in which a PS plate is conveyed and immersed in a processing solution contained in a tank by the action of dipped guide rolls to thus develop the plate. In such automatic development, the processing can be performed while supplementing a replenisher to each processing tank in proportion to the quantity of PS plates processed and the running time of the machine.

The PS plate of the invention can be processed by a so-called throwaway-processing system in which the PS plate is processed with a substantially fresh processing solution.

The lithographic printing plate obtained through the foregoing processing is fitted to an offset printing press to form a large number of copies.

The present invention will hereinafter be explained in more detail with reference to the following non-limitative working Examples and the effect practically accomplished by the invention will also be discussed in detail in comparison with Comparative Examples.

Examples 1 to 10 and Comparative Examples 1 to 7

An aluminum plate having a thickness of 0.3 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was neutralized and washed with a 20% $HNO_3$ solution and then washed with water. The plate was then electrolytically surface-roughened in a 1% aqueous solution of nitric acid at an anodic voltage, $V_A$, of 12.7 V such that the quantity of electricity was 160 coulomb/$dm^2$ using a sinusoidal alternating wave current. At this stage, the surface roughness thereof was determined to be 0.6 μ (expressed in terms of the Ra unit). Then it was desmutted by immersing in a 30% aqueous solution of sulfuric acid at 55° C. for 2 minutes and anodized in a 20% aqueous solution of sulfuric acid at a current density of 2 A/$dm^2$ so that the thickness of the resulting anodized layer was 2.7 g/$m^2$ to thus prepare a substrate.

The following photosensitive solution was applied onto the surface of the aluminum plate thus treated in an amount of 2.5 g/$m^2$ (weighed after drying) and then dried. Photosensitive Solution

| Component | Amount (part by weight) |
|---|---|
| Esterified product of 1,2-diazonaphthoquinone-5-sulfonyl chloride and pyrogallol/acetone resin (disclosed in Example 1 of U.S. Pat. No. 3,635,709) | 0.45 |
| Cresol/formaldehyde novolak resin | 1.1 |
| 2-(p-methoxyphenyl)-4,6-bis(trichloromethyl)-s-triazine | 0.02 |
| Oil Blue #603 (available from Orient Chemical Industries Co., Ltd.) | 0.01 |
| Megafac F-177 (fluorine atom-containing surfactant available from Dainippon Ink and Chemicals, Inc.) | 0.004 |
| Methyl ethyl ketone | 10 |
| Propylene glycol monomethyl ether | 10 |

A mat layer was formed on the photosensitive layer thus applied by spraying a mat layer-forming resin solution on the surface thereof in the following manner.

A mat layer-forming resin solution was prepared by dissolving a methyl methacrylate/ethyl acrylate/acrylic acid (charge weight ratio=65:20:15) copolymer which had been partially converted into sodium salt (or optionally potassium or ammonium salt) in a concentration of 12% and a mat layer was formed by spraying the resin solution on the photosensitive layer with a rotary electrostatic spraying machine at a number of rotation of the spraying head of 25,000 rpm, a feed of the resin solution of 40 ml/min, a voltage applied to the spraying head of −90 KV, an ambient temperature during coating of 25° C. and a relative humidity of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds. The average height of projections on the resulting mat layer was about 6 μm, the size of the projection was about 30 μm on the average and the coated amount of the layer was 150 mg/m$^2$.

To 100 parts by weight of methyl ethyl ketone, there was dissolved 3.0 parts by weight of A: a phenoxy resin (PhenoToto YP-50, available from Toto Chemical Industry Co., Ltd.), B: a saturated copolymerized polyester resin (Kemit K-1294, available from Toray Industries, Inc.), C: a polyvinyl butyral resin (Denka Butyral 3000-K, available from Denki Kagaku Kogyo K. K.), D: a polyvinyl butyral resin (S-LEC BM-1, available from Sekisui Chemical Co., Ltd.), E: a polyvinyl butyral resin (S-LEC BL-S, available from Sekisui Chemical Co., Ltd.), F: a saturated copolymerized polyester resin (Kemit K-1089, available from Toray Industries, Inc.), G: a polyurethane resin (Desmolac 2100, available from Nippon Polyurethane Industry Co., Ltd.), H: a saturated copolymerized polyester resin (Kemit R-248, available from Toray Industries, Inc.) or I: a polyurethane resin (Estane #5715, available from Monsanto Company) and then 0.05 part by weight of Megafac F-177 (a fluorine atom-containing surfactant, available from Dainippon Ink and Chemicals, Inc.) was dissolved in each solution to give each back coat solution. Each back coat solution was applied onto the back face of the PS plate produced above to a thickness of 0.1 to 10.0 μm (determined after drying) to thus give PS plates 1 to 15. A comparative PS plate 16 in which any back coat layer was not applied was also prepared.

Each of these PS plates was cut into sheets of 1003 mm×800 mm (30 sheets for each PS plate). These 30 sheets were put in piles and sandwiched between two sheets of paper board having a thickness of about 0.5 mm, then four corners thereof were fixed by an adhesive tape and the resulting assembly was packaged in aluminum kraft paper. The package was further packed in a corrugated cardboard box, fixed by an adhesive tape and then subjected to a trucking test. The same test was performed, by way of comparison, while each PS plate was sandwiched between two sheets of slip paper (i.e., an interleaf) having a thickness of about 40 μm and laminated with polyethylene film of 10 μm (Sample 17). The PS plates were examined on whether scratches were formed on the photosensitive layer or not. The results thus obtained are summarized in Table 1.

Then 1,500 sheets each of these 17 kinds of PS plates were put in piles and sandwiched between two backplates of iron, fastened with bolts for a large-scale transportation and stored in this condition for 5 months. Thereafter, the bolts were unfastened and the adhesion between the neighbouring PS plates was evaluated. The results (presence or absence of adhesion and peeling off of the films) are summarized in Table 1.

The formation of scratches on the photosensitive layer due to vibration during transportation could be inhibited by the application of various resins as back coat layers. The results indicate that the use of resins having glass transition points of not less than 20° C. is required for preventing the adhesion between PS plates upon packaging a large number of PS plates in piles and corresponding peeling off of the films. Preferred results were obtained when resins having glass transition points of not less than 30° C. were used.

Then each of the foregoing 16 kinds of PS plates was cut into a sheet having a size of 1310 mm×1050 mm and imagewise exposed to light from a 3 KW metal halide lamp at a distance of 1 m through an original film for 60 seconds.

To a developing bath of a commercially available automatic developing machine PS-900D (available from Fuji Photo Film Co., Ltd.) equipped with a dip-type developing bath, there was charged a developer comprising a potassium silicate aqueous solution having a molar ratio: $[SiO_2]/[M_2O]$ of 1.2 and an $SiO_2$ content of 1.5 (% by weight) and 0.04% by weight of an amphoteric surfactant, i.e., N-alkyl-N,N-dihydroxyethyl betaine and the foregoing imagewise exposed PS plates were then processed. As a result, all of Samples of the invention could be developed without any trouble and any peeling off of the back coat layers was not observed.

TABLE 1

| Ex. No. | Sample No. | G.T.P. (*1) (°C.) | Thickness of Back Coat, μm | Scratches Formed During Transportation (*2) | Adhesion During Storage in Piles (*3) |
|---|---|---|---|---|---|
| 1 | 1 | 100 | 0.2 | None | None |
| 2 | 2 | 100 | 5.0 | None | None |
| 3 | 3 | 67 | 0.2 | None | None |
| 4 | 4 | 65 | 0.2 | None | None |
| 5 | 5 | 65 | 5.0 | None | None |
| 1* | 6 | 65 | 10.0 | None | observed |
| 6 | 7 | 62 | 0.2 | None | None |
| 7 | 8 | 54 | 0.2 | None | None |
| 8 | 9 | 43 | 0.2 | None | None |
| 9 | 10 | 30 | 0.2 | None | None |
| 10 | 11 | 30 | 5.0 | None | None |
| 2* | 12 | 30 | 10.0 | None | observed |
| 3* | 13 | 18 | 0.2 | None | observed |
| 4* | 14 | 18 | 5.0 | None | observed |
| 5* | 15 | 18 | 7.5 | None | observed |
| 6* | 16 | — | — | observed | observed |
| 7* | 17 | (interleaf was used) | | None | None |

*: Comparative Example.
*1: Glass transition point of the resin used for the back coat layer.
*2: Presence or absence of scratches on the photosensitive layer during transportation.
*3: Adhesion between the photosensitive layer and the back face of the PS plate during storing the PS plates put in piles.

Examples 11 to 17 and Comparative Examples 8 and 9

An aluminum plate having a thickness of 0.24 mm was surface-grained with a nylon brush and an aqueous suspension of 400 mesh pumice stone and then sufficiently washed with water. After etching the plate by immersing in a 10% sodium hydroxide solution at 70° C. for 20 seconds and washing with running water, the plate was neutralized and washed with a 20% $HNO_3$ solution and then washed with water. The plate was then electrolytically surface-roughened in a 0.7% aqueous solution of nitric acid at an anodic voltage, $V_A$, of 12.7 V such that the quantity of electricity was 400 coulomb/dm$^2$ using a sinusoidal alternating wave current. Then the plate was treated in a 10% sodium hydroxide aqueous solution so that the amount of aluminum dissolved was 0.9 g/m$^2$. After washing with water and neutralizing and washing the plate in a 20% nitric acid solution to desmut the plate, the plate was anodized in a 18% aqueous solution of sulfuric acid so that the thickness of the resulting anodized layer was 3 g/m². Thereafter, the plate was treated with a 2% sodium silicate aqueous solution maintained at 30° C. for 30 seconds to thus prepare a substrate.

The following photosensitive solution was prepared and applied onto the surface of the substrate thus treated in an amount of 2.5 g/m² (weighed after drying) and then dried.

Photosensitive Solution

| Component | Amount (part by weight) |
|---|---|
| Esterified product of 1,2-diazonaphthoquinone-5-sulfonyl chloride and pyrogallol/acetone resin (disclosed in Example 1 of U.S. Pat. No. 3,635,709) | 0.76 |
| Cresol/formaldehyde novolak resin | 1.9 |
| Phthalic anhydride | 0.2 |
| 4-(p-N-(p-hydroxybenzoyl)aminophenyl)-2,6-bis-(trichloromethyl)-s-triazine | 0.02 |
| Victoria Pure Blue (available from Hodogaya Chemical Co., Ltd.) | 0.03 |
| Megafac F-177 (fluorine atom-containing surfactant available from Dainippon Ink and Chemicals, Inc.) | 0.006 |
| Methyl ethyl ketone | 15 |
| Propylene glycol monomethyl ether | 15 |

A mat layer was formed on the photosensitive layer thus applied by spraying a mat layer-forming resin solution on the surface thereof in the following manner.

A mat layer-forming resin solution was prepared by dissolving, in water, a methyl methacrylate/ethyl acrylate/2-acrylamido-2-methylpropanesulfonic acid (charge weight ratio= 50:30:20) in a concentration of 14% and a mat layer was by spraying the resin solution on the photosensitive layer with a rotary electrostatic spraying machine at a number of rotation of the spraying head of 25,000 rpm, a feed of the resin solution of 40 ml/min, a voltage applied to the spraying head of −90 KV, an ambient temperature during coating of 25° C. and a relative humidity of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds. The average height of projections on the resulting mat layer was about 5 μm, the size of the projection was 25 to 40 μ m and the coated amount of the layer was 120 mg/m².

To a mixture of 30 parts by weight of ethylene glycol monomethyl ether and 70 parts by weight of methyl ethyl ketone, there was dissolved 3.0 parts by weight of a polyvinyl butyral resin (Denka Butyral 3000-K, available from Denki Kagaku Kogyo K. K.; glass transition point=65° C.) and then 0.03 part by weight of Megafac F-177 (a fluorine atom-containing surfactant, available from Dainippon Ink and Chemicals, Inc.) to give a back coat solution. The back coat solution was applied onto the back face of the PS plate produced above in a thickness of 0.1, 0.2, 0.5, 1.0, 2.5, 5.0, 7.5, 10 and 15 μm (determined after drying) and then dried to thus give PS plates 18 to 26 (Table 2).

The same transportation test and adhesion test under a large-scale packaged condition used in Example 1 were performed using these PS plates prepared. The results obtained are listed in Table 2.

TABLE 2

| Ex. No. | Sample No. | Thickness of Back Coat, μm | Scratches Formed (*1) | Adhesion During Storing in Piles(*2) |
|---|---|---|---|---|
| 11 | 18 | 0.01 | None | None |
| 12 | 19 | 0.2 | None | None |
| 13 | 20 | 0.5 | None | None |
| 14 | 21 | 1.0 | None | None |
| 15 | 22 | 2.5 | None | None |
| 16 | 23 | 5.0 | None | None |
| 17 | 24 | 7.5 | None | None |
| 8* | 25 | 10 | None | observed |
| 9* | 26 | 15 | None | observed |

*: Comparative Example.
*1: Presence or absence of scratches on the photosensitive layer during transportation.
*2: Adhesion between the photosensitive layer and the back face of the PS plate during storing the PS plates put in piles.

Examples 18 to 26 and Comparative Examples 10 to 16

A plurality of PS plates were prepared by surface-treating substrates and applying photosensitive layers according to the same procedures and photosensitive solution used in Example 1.

Two back coat solutions were prepared by dissolving 3.0 parts by weight of a polyester resin (Kemit K-1294, Tg (glass transition point)=67° C.; available from Toray Industries, Inc.) in 100 parts by weight of methyl ethyl ketone, and dissolving 3. 0 parts by weight of another polyester resin (Kemit K-1089, available from Toray Industries, Inc.) in a mixed solvent comprising 60 parts by weight of methyl ethyl ketone and 40 parts by weight of toluene and then further dissolving 0.05 part by weight each of Megafac F-177 (fluorine atom-containing surfactant available from Dainippon Ink and Chemicals, Inc.) and 0.2 part by weight each of Victoria Pure Blue BOH (dye available from Hodogaya Chemical Co., Ltd.) in the foregoing two solutions. These back coat solutions were applied onto the back faces of the PS plates prepared above to thicknesses of 0.2 and 5.0 μm (determined after drying) and then dried.

The following mat layer-forming solution was applied onto the photosensitive layers of the foregoing PS plates while variously changing the coating conditions using a rotary electrostatic spray coating machine to form mat layers shown in Table 3 and to thus give PS plates 27 to 38. On the other hand, PS plates 39 to 42 which were free of back coat were also prepared by way of comparison.

A mat layer-forming resin solution was prepared by dissolving a methyl methacrylate/ethyl acrylate/acrylic acid (charge weight ratio=65:20:15) copolymer which had been partially converted into sodium salt in a concentration of 12%. The mat layer was formed at an ambient temperature during coating of 25° C. and a relative humidity of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds.

These 20 kinds of PS plates each was packaged in the same manner used in Example 1 and subjected to the trucking test. The results are listed in Table 3.

The formation of scratches due to the vibration during the transportation could be eliminated by the application of the back coat, but it could not be eliminated when the average diameter of projections on the mat layer was large and the back coat layer was thick.

Then 1,500 sheets each of 20 kinds of these PS plates were put in layers and the adhesion between the neighbouring PS plates under a large-scale transportation condition was determined in the same manner used in Example 1. The results (presence or absence of adhesion and the corresponding peeling off of the photosensitive layer) are listed in Table 3.

The adhesion between the photosensitive layer of the PS plate and the back face of another PS plate and corresponding peeling off of the photosensitive layer could be prevented by the application of the back coat layer, but these phenomena could not be suppressed when the average diameter of projections on the mat layer was great and the back coat layer was thick.

| Component | Amount (part by weight) |
|---|---|
| $PF_6$ salt of p-diazodiphenylamine/ paraformaldehyde condensate | 0.12 |
| 2-hydroxyethyl methacrylate copolymer (prepared by the method disclosed in Example 1 of U.K. Pat. No. 1,505,739) | 2.0 |
| Victoria Pure Blue BOH (available from Hodogaya Chemical Co., Ltd.) | 0.03 |
| Megafac F-177 (fluorine atom-containing surfactant available from Dainippon Ink and Chemicals, Inc.) | 0.006 |
| 2-methoxyethanol | 15 |
| methanol | 10 |

TABLE 3

| Ex. No. | Sample No. | Back Coat Thickness (μm) | Mat Layer $D_{av}$ μm | Mat Layer H μm | Mat Layer Coated Amount | Scratch Formed (*1) | Adhesion During Storage (*2) |
|---|---|---|---|---|---|---|---|
| 18 | 27 | K-1294, 0.2 | 30 | 4.5 | 25(mg/m$^2$) | None | None |
| 19 | 28 | K-1294, 0.2 | 60 | 7.2 | 85 | None | None |
| 20 | 29 | K-1294, 0.2 | 100 | 9.5 | 150 | None | None |
| 10* | 30 | K-1294, 0.2 | 200 | 15.0 | 300 | observed | observed |
| 21 | 31 | K-1294, 5.0 | 30 | 4.5 | 25 | None | None |
| 22 | 32 | K-1294, 5.0 | 60 | 7.2 | 85 | None | None |
| 23 | 33 | K-1294, 5.0 | 100 | 9.5 | 150 | None | None |
| 11* | 34 | K-1294, 5.0 | 200 | 15.0 | 300 | observed | observed |
| 24 | 35 | K-1089, 0.2 | 30 | 4.5 | 25 | None | None |
| 25 | 36 | K-1089, 0.2 | 60 | 7.2 | 85 | None | None |
| 26 | 37 | K-1089, 0.2 | 100 | 9.5 | 150 | None | None |
| 12* | 38 | K-1089, 0.2 | 200 | 15.0 | 300 | observed | observed |
| 13* | 39 | no back coat | 30 | 4.5 | 25 | observed | observed |
| 14* | 40 | no back coat | 60 | 7.2 | 85 | observed | observed |
| 15* | 41 | no back coat | 100 | 9.5 | 150 | observed | observed |
| 16* | 42 | no back coat | 200 | 15.0 | 300 | observed | observed |

*: Comparative Example.
*1: Scratches formed on the photosensitive layer during transportation.
*2: Adhesion between the photosensitive layer and the back face during storing PS plates in piles.

Examples 27, 28; Comparative Examples 17, 18

An aluminum plate having a thickness of 0.2 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was electrolytically surface-roughened in a 1% aqueous solution of nitric acid at an anodic voltage, $V_A$, of 12.7 V such that the quantity of electricity was 160 coulomb/dm$^2$ using a sinusoidal alternating wave current. Then it was desmutted by immersing in a 30% aqueous solution of sulfuric acid at 55° C. for 2 minutes, anodized in a 20% aqueous solution of sulfuric acid at a current density of 2 A/dm$^2$ so that the thickness of the resulting anodized layer was 2.7 g/m$^2$ and further hydrophilized with a 2% aqueous solution of No. 3 sodium silicate at 70° C. to thus prepare a substrate.

The following photosensitive solution was applied onto the surface of the aluminum plate thus treated in an amount of 1.7 g/m$^2$ (weighed after drying) and then dried.
Photosensitive Solution -continued

| Component | Amount (part by weight) |
|---|---|
| ethylene chloride | 5 |

A mat layer was formed on the photosensitive layer thus applied by spraying a mat layer-forming resin solution on the surface thereof in the following manner.

A mat layer-forming resin solution was prepared by dissolving a methyl methacrylate/ethyl acrylate/2-acrylamido- 2-methylpropanesulfonic acid (charge weight ratio= 50:30:20) copolymer in a concentration of 14% and a mat layer was formed by spraying the resin solution on the photosensitive layer with a rotary electrostatic spraying machine at a number of rotation of the spraying head of 25,000 rpm, a feed of the resin solution of 40 ml/min, a voltage applied to the spraying head of −90 KV, an ambient temperature during coating of 25° C. and a relative humidity of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds. The average height of projections of the resulting mat layer was about 5 μm, the size of the projection was about 25 μm on the average and the coated amount of the layer was 130 mg/m².

To 100 parts by weight of methyl ethyl ketone, there were dissolved 3.0 parts by weight each of a phenoxy resin (PhenoToto YP-50, available from Toto Chemical Industry Co., Ltd.) and a saturated copolymerized polyester resin (Kemit K-1294, available from Toray Industries, Inc.) and then 0.05 part by weight of Megafac F-177 (a fluorine atom-containing surfactant, available from Dainippon Ink and Chemicals, Inc.) was dissolved in the solution to give a back coat solution. The back coat solution was applied onto the back face of the PS plate produced above in a thickness of 0.2 μm (determined after drying) to thus give PS plates 43 and 44. A comparative PS plate 45 in which any back coat layer was not applied was also prepared.

These 3 kinds of negative-working PS plates were packaged and subjected to a trucking test in the same manner used in Example 1. The same test was performed, by way of comparison, while each PS plate (Sample 45) was sandwiched between two sheets of slip paper having a thickness of about 40 μm and laminated with polyethylene film of 10 μm (Sample 46). The PS plates were examined on whether scratches were formed on the photosensitive layer or not. The results thus obtained are summarized in Table 4.

Then these four kinds of PS plates each was subjected to 5 month-storage test under a large-scale transportation condition in the same manner used in Example 1. Thus, the adhesion between the neighbouring PS plates was evaluated. The results (presence or absence of adhesion and peeling off of the films) are summarized in Table 4.

The formation of scratches on the photosensitive layer due to vibration during transportation could be inhibited by the application of a back coat layer, in case of negative-working PS plates and the adhesion and corresponding peeling off of the films could likewise be inhibited.

aqueous solution of sulfuric acid at a current density of 2 A/dm² so that the thickness of the resulting anodized layer was 2.7 g/m² to thus prepare a substrate.

The following photosensitive solution was applied onto the surface of the aluminum plate thus treated in an amount of 2.5 g/m² (weighed after drying) and then dried.

Photosensitive Solution

| Component | Amount (part by weight) |
|---|---|
| Esterified product of 1,2-diazonaphthoquinone-5-sulfonyl chloride and pyrogallol/acetone resin (disclosed in Example 1 of U.S. Pat. No. 3,635,709) | 0.45 |
| Cresol/formaldehyde novolak resin | 1.1 |
| 2-(p-methoxyphenyl)-4,6-bis(trichloromethyl)-s-triazine | 0.02 |
| Oil Blue #603 (available from Orient Chemical Industries Co.,-Ltd.) | 0.01 |
| Megafac F-177 (fluorine atom-containing surfactant available from Dainippon Ink and Chemicals, Inc.) | 0.004 |
| Methyl ethyl ketone | 10 |
| Propylene glycol monomethyl ether | 10 |

A mat layer was formed on the photosensitive layer thus applied by spraying a mat layer-forming resin solution on the surface thereof in the following manner.

A mat layer-forming resin solution was prepared by dissolving a methyl methacrylate/ethyl acrylate/acrylic acid (charge weight ratio=65:20:15) copolymer which had been partially converted into sodium salt (or optionally potassium or ammonium salt) in a concentration of 12% and a mat layer was formed by spraying the resin solution on the photosensitive layer with a rotary electrostatic spraying machine at a number of rotation of the spraying head of 25,000 rpm, a feed of the resin solution of 40 ml/min, a voltage applied to the spraying head of −90 KV, an ambient temperature during coating of 25° C. and a relative humidity

TABLE 4

| Ex. No. | Sample No. | Back Coat Resin Trade Name | Tg (°C.) | Thickness of Back Coat, μm | Scratches Formed (*1) | Adhesion During Storage in Piles(*2) |
|---|---|---|---|---|---|---|
| 27 | 43 | PhenoToto YP-50 | 100 | 0.2 | None | None |
| 28 | 44 | Kemit K-1294 | 67 | 0.2 | None | None |
| 17* | 45 | None | | | observed | observed |
| 18* | 46 | (interleaf was used) | | | None | None |

*: Comparative Example.
*1: Scratches formed on the photosensitive layer during transportation.
*2: Adhesion between the photosensitive layer and the back face during storing PS plates put in piles.

Example 29; Comparative Examples 19, 20

An aluminum plate having a thickness of 0.3 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was neutralized and washed with a 20% $HNO_3$ solution and then washed with water. The plate was then electrolytically surface-roughened in a 1% aqueous solution of nitric acid at an anodic voltage, $V_A$, of 12.7 V such that the quantity of electricity was 160 coulomb/dm² using a sinusoidal alternating wave current. At this stage, the surface roughness thereof was determined to be 0.6 μ (expressed in terms of the Ra unit). Then it was desmutted by immersing in a 30% aqueous solution of sulfuric acid at 55° C. for 2 minutes and anodized in a 20% of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds. The average height of projections of the resulting mat layer was about 6 μm, the size of the projection was about 30 μm on the average and the coated amount of the layer was 150 mg/m².

To 100 parts by weight of methyl ethyl ketone, there was dissolved 3.0 parts by weight of a saturated copolymerized polyester resin (comprising terephthalic acid, isophthalic acid, ethylene glycol and neopentyl glycol in a ratio of 1:1:1:1, having a molecular weight of 18,000 and a glass transition point (Tg) of 67° C.) and then 0.05 part by weight of Megafac F-177 (a fluorine atom-containing surfactant, available from Dainippon Ink and Chemicals, Inc.) was dissolved in the solution to give a back coat solution. The back coat solution was applied onto the back face of the PS plate produced above to a thickness of 0.1 to 10.0 μm (determined after drying) and then dried to thus give a PS plate 47. A comparative PS plate 48 in which any back coat layer was not applied was also prepared.

Each of these PS plates was cut into sheets of 1003 mm×800 mm (30 sheets for each PS plate). These 30 sheets were put in piles and sandwiched between two sheets of paper board having a thickness of about 0.5 mm, then four corners thereof were fixed by an adhesive tape and the resulting assembly was packaged in aluminum kraft paper. The package was further packed in a corrugated cardboard box, fixed by an adhesive tape and then subjected to a trucking test. The same test was performed, by way of comparison, while each PS plate (Sample 48) was sandwiched between two sheets of slip paper having a thickness of about 40 μm which had been laminated with polyethylene film of 10 μm (Sample 49). The PS plates were examined on whether scratches were formed on the photosensitive layer or not after the transportation. The results thus obtained are summarized in Table 5.

Then 1,500 sheets of each kind of PS plate were put in piles and sandwiched between two backplates of iron, fastened with bolts for a large-scale transportation and stored in this condition for 5 months. Thereafter, the bolts were unfastened and the adhesion between the neighbouring PS plates was evaluated. The results (presence or absence of adhesion and peeling off of the films) are summarized in Table 5.

The formation of scratches on the photosensitive layer due to vibration during transportation could be inhibited by the application of the back coat layer of the saturated copolymerized polyester resin. In addition, the used of such a back coat inhibited any adhesion under a large-scale packaged condition and corresponding peeling off of the films.

Then each of the foregoing PS plates 47 and 48 was cut into a large number of sheets each having a size of 1310 mm×1050 mm and imagewise exposed to light from a 3 KW metal halide lamp at a distance of 1 m through an original film for 60 seconds.

To a developing bath of a commercially available automatic developing machine PS-900D (available from Fuji Photo Film Co., Ltd.) equipped with a dip-type developing bath, there was charged a developer comprising a potassium silicate aqueous solution having a molar ratio: $[SiO_2]/[K_2O]$ of 1.2 and an $SiO_2$ content of 1.5 (% by weight) and 0.04% by weight of an amphoteric surfactant, i.e., N-alkyl-N,N-dihydroxyethyl betaine and the foregoing imagewise exposed PS plates were then processed in the developing bath maintained at 30° C. at a dipping time of 12 seconds. As a result, all of Samples of the invention could be developed without any trouble and any peeling off of the back coat from the PS plate 47 was not observed.

Then the foregoing imagewise exposed PS plates 47 and 48 were separately processed under the aforementioned automatic developing conditions using an aqueous solution of potassium silicate having a molar ratio: $[SiO_2]/[K_2O]$ of 0.45 and an $SiO_2$ content of 0.98 (% by weight) as a replenisher at a rate of 30 plates/day over one month. In this respect, the reduction in the activity of the developer due to processing of the PS plates and carbon dioxide in the air was detected by a built-in conductivity sensor of PS-900D and the replenisher was supplemented by a feedback control system using a computer to thus maintain the activity of the developer. The check of the activity was performed by developing a PS plate which was gradually exposed to light while the quantity of light was stepwise changed using Step Tablet (comprising 15 steps and having an optical density difference of 0.15), reading the number of step where an image remained in proportion to the quantity of irradiated light and comparing the number of step to that observed at the initial stage of the processing. The results of the running processing are listed in Table 5. As seen from the results, insolubles were not formed during the processing of the PS plate of the invention provided with the back coat and thus stable processing could be ensured. In case of the conventional PS plate 48 (Comparative Example 19), however, insolubles were formed due to the dissolution of aluminum oxide and this resulted in various troubles such as the contamination of the processed plate, clogging of spray nozzles and filters and the deposition of white precipitates on the surface of rollers. Moreover, any stable activity of the developer was not ensured.

TABLE 5

| Ex. No. | Sample No. | Thickness of Back Coat (μm) | Scratches Formed on Photosensitive layer upon Transportation | Adhesion During Storage(*1) |
| --- | --- | --- | --- | --- |
| 29 | 47 | 0.2 | None | None |
| 19* | 48 | — | observed | observed |
| 20* | 49 | (use of interleaf) | None | None |

| | | Suitability of Running Processing | |
| --- | --- | --- | --- |
| | Ex. No. | Change in Activity of Developer | Formation of Insolubles |
| | 29 | ±0.5 step | None |
| | 19* | ±2.5 step | observed |
| | 20* | — | — |

*: Comparative Example.
*1: Adhesion between the photosensitive layer and the back face during storing the PS plates put in piles.

Examples 30 to 36; Comparative Examples 21 and 22

The same procedures used in Example 29 were repeated except that the coated amounts of the back coat layers were changed to those listed in Table 6 to prepare positive-working PS plates 50 to 58 and the same tests performed in Example 29 were carried out. The results thus obtained are summarized in Table 6.

TABLE 6

| Ex. No. | Sample No. | Thickness of Back Coat μm | Scratches Formed on Photosensitive Layer During Transportation | Adhesion Between Photosensitive layer and Back Face During Storing in Piles |
| --- | --- | --- | --- | --- |
| 30 | 50 | 0.01 | None | None |
| 31 | 51 | 0.2 | None | None |
| 32 | 52 | 0.5 | None | None |
| 33 | 53 | 1.0 | None | None |
| 34 | 54 | 2.5 | None | None |
| 35 | 55 | 5.0 | None | None |
| 36 | 56 | 7.5 | None | None |
| 21* | 57 | 10 | None | observed |
| 22* | 58 | 15 | None | observed |

Examples 37 to 39; Comparative Examples 23 to 25

An aluminum plate having a thickness of 0.24 mm was surface-grained with a nylon brush and an aqueous suspension of 400 mesh pumice stone and then sufficiently washed with water. After etching the plate by immersing in a 10% sodium hydroxide solution at 70° C. for 20 seconds and washing with running water, the plate was neutralized and washed with a 20% HNO₃ solution and then washed with water. The plate was then electrolytically surface-roughened in a 0.7% aqueous solution of nitric acid at an anodic voltage, $V_A$, of 12.7 V such that the quantity of electricity was 400 coulomb/dm² using a sinusoidal alternating wave current. Then the plate was treated in a 10% sodium hydroxide aqueous solution so that the amount of aluminum dissolved was 0.9 g/m². After washing with water and neutralizing and washing the plate in a 20% nitric acid solution to desmut the plate, the plate was anodized in a 18% aqueous solution of sulfuric acid so that the thickness of the resulting anodized layer was 3 g/m². Thereafter, the plate was treated with a 2% sodium silicate aqueous solution maintained at 30° C. for 30 seconds to thus prepare a substrate.

Then six kinds of back coat solutions each was prepared by dissolving, in a mixture comprising 50 parts by weight of methylethyl ketone and 50 parts by weight of toluene, 3.0 parts by weight of a saturated copolymerized polyester resin (Kemit R-99, Tg×−19° C.; Kemit R-185, Tg=8° C.; Kemit R-282, Tg=15° C.; Kemit K-1089, Tg=43° C.; Kemit K-1294, Tg=67° C.; or Kemit K-588, Tg=100° C., these are all available from Toray Industries, Inc.), 0.05 part by weight of Megafac F-177 (fluorine atom-containing surfactant available from Dainippon Ink and Chemicals, Inc.) and 0.2 part by weight of Victoria Pure Blue BOH (dye available from Hodogaya Chemical Co., Ltd.). Each back coat solution was applied to the surface of the aluminum plate opposite to the grained surface thereof to a thickness of 0.2 μm (determined after drying) and then dried.

Then the following photosensitive solution was prepared and applied onto the grained surface of the substrate thus treated in an amount of 2.5 g/m² (weighed after drying) and then dried to give PS plates 59 to 64.

Photosensitive Solution

| Component | Amount (part by weight) |
|---|---|
| Esterified product of 1,2-diazonaphthoquinone-5-sulfonyl chloride and pyrogallol/acetone resin (disclosed in Example 1 of U.S. Pat. No. 3,635,709) | 0.76 |
| Cresol/formaldehyde novolak resin | 1.9 |
| Phthalic anhydride | 0.2 |
| 4-(p-N-(p-hydroxybenzoyl)aminophenyl)-2,6-bis-(trichloromethyl)-s-triazine | 0.02 |
| Victoria Pure Blue BOH (available from Hodogaya Chemical Co., Ltd.) | 0.03 |
| Megafac F-177 (fluorine atom-containing surfactant available from Dainippon Ink and Chemicals, Inc.) | 0.006 |
| Methyl ethyl ketone | 15 |
| Propylene glycol monomethyl ether | 15 |

A mat layer was then formed on the photosensitive layers of the PS plates 59 to 64 by spraying a mat layer-forming resin solution on the surface thereof in the following manner.

A mat layer-forming resin solution was prepared by dissolving, in water, a methyl methacrylate/ethyl acrylate/2-acrylamido-2-methylpropanesulfonic acid (charge weight ratio=30:20) copolymer in a concentration of 14% and a mat layer was formed by spraying the resin solution on the photosensitive layer with a rotary electrostatic spraying machine at a number of rotation of the spraying head of 25,000 rpm, a feed of the resin solution of 40 ml/min, a voltage applied to the spraying head of −90 KV, an ambient temperature during coating of 25° C. and a relative humidity of 50%. Water vapor was sprayed on the coated surface 2.5 seconds after coating to humidify the coated layer and 3 seconds after the moistening, the coated layer was dried by blowing hot air (60° C. and humidity 10%) on the surface for 5 seconds. The average height of projections on the resulting mat layer was about 5 μm, the size of the projection was 25 to 40 μm and the coated amount of the layer was 120 mg/m².

The PS plates thus produced were subjected to the same trucking test and the adhesion test under a large-scale packaged condition, in the same manner used in Example 29. The results obtained are listed in Table 7.

TABLE 7

| Ex. No. | Sample No. | Back Coat Resin Name | Tg (°C.) | Scratches Formed (*1) | Adhesion During Storage in Piles(*2) |
|---|---|---|---|---|---|
| 23* | 59 | R-99 | −19 | None | observed |
| 24* | 60 | R-185 | 8 | None | observed |
| 25* | 61 | R-282 | 15 | None | observed |
| 37 | 62 | K-1089 | 43 | None | None |
| 38 | 63 | K-1294 | 67 | None | None |
| 39 | 64 | K-588 | 100 | None | None |

*: Comparative Example.
*1: Scratches formed on the photosensitive layer during transportation.
*2: Adhesion between the photosensitive layer and the back face during storing PS plates put in piles.

Example 40

An aluminum plate having a thickness of 0.30 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was neutralized and washed with a 20% HNO₃ solution and then washed with water. The plate was then electrolytically surface-roughened in a 1% aqueous solution of nitric acid at an anodic voltage, $V_A$, of 12.7 V such that the quantity of electricity was 160 coulomb/dm² using a sinusoidal alternating wave current. At this stage, the surface roughness thereof was determined to be 0.6 μ (expressed in terms of the Ra unit). Then it was desmutted by immersing in a 30% aqueous solution of sulfuric acid at 55° C. for 2 minutes and anodized in a 20% aqueous solution of sulfuric acid at a current density of 2 A/dm² for 2 minutes so that the thickness of the resulting anodized layer was 1.5 g/m² to thus prepare a substrate.

Then, after immersing the plate in a 2.5% aqueous solution of sodium silicate maintained at 70° C. for one minute, washing with water and drying, the back coat solution used in Example 29 was applied to the surface of the plate opposite to the grained surface thereof to a thickness of 0.2 μm (determined after drying).

The following photosensitive solution I was applied onto the grained surface of the aluminum plate thus treated in an amount of 1.5 g/m² (weighed after drying) and then dried at 80° C. for 2 minutes to give a negative-working PS plate provided with a back coat layer.

Photosensitive Solution I

| Component | Amount (part by weight) |
|---|---|
| Methyl methacrylate/N-(6-(methacryloyloxy)-hexyl) 2,3-dimethylmaleimide/methacrylic acid (molar ratio = 10/60/30) copolymer (Mw = 3.5 × 10⁴(GPC); Tg = about 40° C. (DSC)) | 5 |
| 3-Ethoxycarbonyl-7-methyl-thioxanthone | 0.25 |
| Dodecylbenzenesulfonate of co-condensate of 4-diazo-diphenylamine, phenoxy acetic acid and formaldehyde | 0.20 |
| Propylene glycol monomethyl ether | 50 |

-continued

| Component | Amount (part by weight) |
|---|---|
| Methyl ethyl ketone | 50 |
| Megafac F-177 (fluorine atom-containing surfactant available from Dainippon Ink and Chemicals, Inc.) | 0.03 |
| Victoria Pure Blue BOH (available from Hodogaya Chemical Co., Ltd.) | 0.10 |

A mat layer was formed on the photosensitive layer thus applied by spraying a mat layer-forming resin solution on the surface of the photosensitive layer in the following manner.

A mat layer-forming solution was prepared by dissolving, in water, a mat layer-forming resin: methyl methacrylate/ ethyl acrylate/2-acrylamido-2-methylpropanesulfonic acid (charge weight ratio=50:30:20) copolymer in a concentration of 14% and sprayed on the photosensitive layer using a rotary electrostatic spraying machine at a number of revolution of the spraying head of 25,000 rpm, a feed of the solution of 40 ml/min, a voltage applied to the spraying head of −90 KV, an ambient temperature during spraying of 25° C. and a relative humidity of 50%. Water vapor was sprayed on the coated layer 2.5 seconds after coating to moisten the layer and 3 seconds after the moistening, hot air (60° C., humidity 10%) was blown on the coated layer for 5 seconds to dry the layer. The height of projections formed on the surface was about 5 μm, the size thereof was about 25 μm on the average and the coated amount of the resin was 130 mg/m$^2$.

The negative-working PS plate thus obtained was subjected to contact exposure through a negative film. The exposure was performed by irradiating the plate with a 2 KW ultrahigh pressure mercury lamp for 60 seconds. The exposed PS plate was developed with a 1.5% by weight aqueous solution of potassium silicate having a molar ratio: [SiO$_2$]/[K] of 0.5 at 25° C. for 30 seconds. After washing the developed plate with water, a gumming solution was applied. The lithographic printing plate was fitted to KORD Printing Press to carry out printing operations. As a result, 50,000 copies whose non-image area was free of contamination were obtained.

A large number of the foregoing negative-working PS plates were prepared and subjected to the trucking test and the test comprising allowing to stand under a large-scale packaged condition in the same manner used in Example 29. These PS plates did not suffer from the problems of the formation of scratches on the photosensitive layer and of the adhesion. The same negative-working PS plate as that prepared above except that any back coat layer was not applied was separately prepared by way of comparison and the quality thereof was evaluated in the same manner. As a result, it was found that it suffered from the problems of the formation of scratches on the photosensitive layer and of adhesion.

Example 41

The same procedures used in Example 40 were repeated to give an aluminum substrate having a grained surface and a back coat layer on the back face. Then the following photosensitive solution II was prepared and applied to the grained surface of the substrate in an amount of 2.0 g/m$^2$ (weighed after drying) and dried at 80° C. for 2 minutes to give a negative-working PS plate provided with a back coat layer.

Photosensitive Solution II

| Component | Amount (part by weight) |
|---|---|
| Diazo resin produced by the following method | 0.5 |
| Polymeric compound obtained by the following method | 5.0 |
| Oil-soluble dye (Victoria Pure Blue BOH) | 0.1 |
| Malic acid | 0.05 |
| 2-Methoxy ethanol | 100 |

(Preparation of Diazo Resin)

Phenoxyacetic acid (7.61 g; 0.0500 mole) and 4-diazodiphenylamine hydrogensulfate (14.7 g; 0.0500 mole) were dissolved in 70 ml of conc. sulfuric acid with ice-cooling. Then paraformaldehyde (3.14 g; 0.100 mole) was slowly added to the reaction solution while controlling the temperature of the solution to not more than 10° C. The reaction solution was continuously stirred for 2 hours with ice-cooling. The solution was poured into 1 l of isopropyl alcohol with ice-cooling to separate yellow precipitates. The yellow precipitates were filtered off and washed with isopropyl alcohol to give a hydrosulfate of a condensate of phenoxyacetic acid-4-diazodiphenylamine and formaldehyde.

The condensate was dissolved in 400 ml of water and a solution of 21.9 g (0.0600 mole) of sodium n-dodecylbenzene-sulfonate in 600 ml of water was added to the solution with vigorous stirring. The resulting yellow precipitates were filtered off and dried to give 22 g of a dodecylbenzenesulfonate of the condensate of phenoxyacetic acid-4-diazodiphenylamine and formaldehyde.

(Preparation of Polymeric Compound)

There were dissolved 26 g of N-(4-hydroxyphenyl) methacrylamide, 13 g of acrylonitrile, 71 g of benzyl acrylate, 12 g of methacrylic acid and 1,642 g of azoisobutyronitrile in 150 ml of a 1:1 acetone/methanol mixture, the atmosphere in the reactor was replaced with nitrogen gas and the reaction system was heated to 60° C. for 8 hours.

After completion of the reaction, the reaction solution was poured into 5 l of water under stirring, followed by filtering off the resulting white precipitates and drying to give 88 g of a polymer compound 1.

The molecular weight of this polymer compound 1 was determined by gel permeation chromatography (GPC) and was found to be 75,000 in terms of weight-average molecular weight.

A mat layer was formed on the photosensitive layer thus applied by spraying a mat layer-forming resin solution on the surface of the photosensitive layer in the following manner.

A mat layer-forming solution was prepared by dissolving, in water, a mat layer-forming resin: methyl methacrylate/ ethyl acrylate/2-acrylamido-2-methylpropanesulfonic acid (charge weight ratio=50:30:20) copolymer in a concentration of 14% and sprayed on the photosensitive layer using a rotary electrostatic spraying machine at a number of revolution of the spraying head of 25,000 rpm, a feed of the solution of 40 ml/min, a voltage applied to the spraying head of −90 KV, an ambient temperature during spraying of 25° C. and a relative humidity of 50%. Water vapor was sprayed on the coated layer 2.5 seconds after coating to moisten the layer and 3 seconds after the moistening, hot air (60° C., humidity 10%) was blown on the coated layer for 5 seconds to dry the layer. The height of projections formed on the surface was about 5 μm, the size thereof was about 25 μm on the average and the coated amount of the resin was 130 mg/m$^2$.

The negative-working PS plate thus prepared showed developability and printing properties identical to those of the PS plate prepared in Example 40.

Examples 42 to 47; Comparative Examples 26 to 31

An aluminum substrate was prepared in the same manner used in Example 29 and a photosensitive layer and a mat layer were likewise applied onto the aluminum substrate in the same manner used in Example 29.

To a mixture comprising 70 parts by weight of methyl ethyl ketone and 30 parts by weight of propylene glycol monomethyl ether, there was dissolved 3.0 parts by weight of A: a phenoxy resin (PhenoToto YP-50, available from Toto Chemical Industry Co., Ltd.), B: a polyvinyl butyral resin (Denka Butyral 3000-K, available from Denki Kagaku Kogyo K. K.), C: a polyvinyl butyral resin (S-LEC BM-1, available from Sekisui Chemical Co., Ltd.), D: a polyvinyl butyral resin (S-LEC BL-S, available from Sekisui Chemical Co., Ltd.) or E: a polyurethane resin (Estane #5715, available from Monsanto Company) and then 0.05 part by weight of Megafac F-177 (a fluorine atom-containing surfactant, available from Dainippon Ink and Chemicals, Inc.) was dissolved in each solution to give each back coat solution. Each back coat solution was applied onto the back face of the PS plate produced above to a thickness of 0.1 to 10.0 μm (determined after drying) and dried to thus give PS plates 59 to 68. A comparative PS plate 69 in which any back coat layer was not applied was also prepared.

Each of these 11 kinds of PS plates was cut into sheets of 1003 mm×800 mm (30 sheets for each PS plate). These 30 sheets were put in piles and sandwiched between two sheets of paper board having a thickness of about 0.5 mm, then four corners thereof were fixed by an adhesive tape and the resulting assembly was packaged in aluminum kraft paper. The package was further packed in a corrugated cardboard box, fixed by an adhesive tape and then subjected to a trucking test. The same test was performed, by way of comparison, while each PS plate 60 was sandwiched between two sheets of slip paper having a thickness of about 40 μm which had been laminated with polyethylene film of 10 μm (Sample 70). The PS plates were examined on whether scratches were formed on the photosensitive layer or not. The results thus obtained are summarized in Table 8.

Then 1,500 sheets of each kind of PS plate were put in piles and sandwiched between two backplates of iron, fastened with bolts for a large-scale transportation and stored in this condition for 5 months. Thereafter, the bolts were unfastened and the adhesion between the neighbouring PS plates was evaluated. The results (presence or absence of adhesion and peeling off of the films) are summarized in Table 8.

The formation of scratches on the photosensitive layer due to vibration during transportation, the adhesion of the photosensitive layer to the back face of the PS plate under a large-scale packaged condition and the corresponding peeling off of the films could be inhibited by the application of a saturated copolymerized polyester resin as back coat layers.

Then each of the foregoing PS plates 59 to 69 was cut into a large number of sheets each having a size of 1310 mm×1050 mm and imagewise exposed to light from a 3 KW metal halide lamp at a distance of 1 m through an original film for 60 seconds.

To a developing bath of a commercially available automatic developing machine PS-900D (available from Fuji Photo Film Co., Ltd.) equipped with a dip-type developing bath, there was charged a developer comprising a potassium silicate aqueous solution having a molar ratio: $[SiO_2]/[M_2O]$ of 1.2 and an $SiO_2$ content of 1.5 and 0.04% by weight of an amphoteric surfactant, i.e., N-alkyl-N,N-dihydroxyethyl betaine and the foregoing imagewise exposed PS plates were then processed. As a result, all of Samples could be developed without any trouble and any peeling off of the back coat from the PS plate 59 was not observed. Moreover, the back coat layer was not peeled off during the subsequent handling and printing operations.

Then the foregoing imagewise exposed PS plates 59 to 69 were separately processed under the aforementioned automatic developing conditions using an aqueous solution of potassium silicate having a molar ratio: $[SiO_2]/[M_2O]$ of 0.45 and an $SiO_2$ content of 0.98 (% by weight) as a replenisher at a rate of 30 plates/day over one month. In this respect, the reduction in the activity of the developer due to processing of the PS plates and carbon dioxide in the air was detected by a built-in conductivity sensor of PS-900D and the replenisher was supplemented by a feedback control system using a computer to thus maintain the activity of the developer. The check of the activity was performed by developing a PS plate which was gradually exposed to light while the quantity of light was stepwise changed using Step Tablet (comprising 15 steps and having a optical density difference of 0.15), reading the number of step where an image remained in proportion to the quantity of irradiated light and comparing the number of step to that observed at the initial stage of the processing. The results of the running processing are listed in Table 8. As seen from the results, insolubles were not formed during the processing of the PS plate of the invention provided with the back coat and thus stable processing could be ensured. In case of the conventional PS plate 69 (Comparative Example 30), however, insolubles were formed due to the dissolution of aluminum oxide and this resulted in various troubles such as the contamination of the processed plate, clogging of spray nozzles and filters and the deposition of white solid materials on the surface of rollers. Moreover, any stable activity of the developer was not ensured.

TABLE 8

| Ex. No. | Sample No. | Resin Used in Back Coat Name | Tg (°C.) | Thickness of Back Coat (μm) | Scratches Formed on Photosensitive layer During Transportation |
|---|---|---|---|---|---|
| 42 | 59 | Phenototo YP-50 | 100 | 0.2 | None |
| 43 | 60 | Phenototo YP-50 | 100 | 5.0 | None |
| 44 | 61 | Butyral 3000-K | 65 | 0.2 | None |

TABLE 8-continued

| Ex. | Sample | Resin Used in Back Coat | Thickness of Back | Scratches Formed on Photosensitive layer |
|---|---|---|---|---|
| 45 | 62 | Butyral 3000-K | 65 | 5.0 | None |
| 26* | 63 | Butyral 3000-K | 65 | 10.0 | None |
| 46 | 64 | S-LEC BM-1 | 62 | 0.2 | None |
| 47 | 65 | S-LEC BL-S | 54 | 0.2 | None |
| 27* | 66 | Estane #5715 | 18 | 0.2 | None |
| 28* | 67 | Estane #5715 | 18 | 5.0 | None |
| 29* | 68 | Estane #5715 | 18 | 7.5 | None |
| 30* | 69 | — | | | observed |
| 31* | 70 | — | (interleaf was used) | | None |

| Ex. No. | Adhesion of Photosensitive Layer to Back Face of PS Plate During Storing PS Plates in Piles | Running Treatment Suitability Change in Activity of Developer | Formation of Insolubles |
|---|---|---|---|
| 42 | None | ±0.5 step | None |
| 43 | None | ±0.5 step | None |
| 44 | None | ±0.5 step | None |
| 45 | None | ±0.5 step | None |
| 26* | observed | ±0.5 step | None |
| 46 | None | ±0.5 step | None |
| 47 | None | ±0.5 step | None |
| 27* | observed | ±0.5 step | None |
| 28* | observed | ±0.5 step | None |
| 29* | observed | ±0.5 step | None |
| 30* | observed | ±2.5 step | observed |
| 31* | None | — | — |

Example 48; Comparative Examples 32, 33

An aluminum plate having a thickness of 0.2 mm was surface-grained with a nylon brush and an aqueous suspension of 400 mesh pumice stone and then sufficiently washed with water. After etching the plate by immersing in a 10% sodium hydroxide solution at 70° C. for 60 seconds and washing with running water, the plate was electrolytically surface-roughened in a 1% aqueous solution of nitric acid at an anodic voltage, $V_A$, of 12.7 V such that the quantity of electricity was 160 coulomb/dm² using a sinusoidal alternating wave current. Then it was desmutted by immersing in a 30% aqueous solution of sulfuric acid at 55° C. for 2 minutes and anodized in a 20% aqueous solution of sulfuric acid at a current density of 2 A/dm² for 2 minutes so that the thickness of the resulting anodized layer was 2.7 g/m² and thereafter hydrophilized with a 2% aqueous solution of No. 3 sodium silicate at 70° C. to thus prepare a substrate.

The following photosensitive solution was applied onto the surface of the aluminum plate thus treated in an amount of 1.7 g/m² (weighed after drying) and then dried to form a photosensitive layer.

Photosensitive Solution

| Component | Amount (part by weight) |
|---|---|
| PF₆ salt of p-diazodiphenylamine/paraformaldehyde condensate | 0.12 |
| 2-hydroxyethyl methacrylate copolymer (prepared by the method disclosed in Example 1 of U.K. Patent No. 1,505,739) | 2.0 |
| Victoria Pure Blue BOH (available from Hodogaya Chemical Co., Ltd.) | 0.03 |
| Megafac F-177 (fluorine atom-containing surfactant available from Dainippon Ink and Chemicals, Inc.) | 0.006 |
| 2-methoxy ethanol | 15 |

-continued

| Component | Amount (part by weight) |
|---|---|
| methanol | 10 |
| ethylene chloride | 5 |

A mat layer was formed on the photosensitive layer thus applied by spraying a mat layer-forming resin solution on the surface of the photosensitive layer in the following manner.

A mat layer-forming solution was prepared by dissolving, in water, a mat layer-forming resin: methyl methacrylate/ethyl acrylate/2-acrylamido-2-methylpropanesulfonic acid (charge weight ratio=50:30:20) copolymer in a concentration of 14% and sprayed on the photosensitive layer using a rotary electrostatic spraying machine at a number of revolution of the spraying head of 25,000 rpm, a feed of the solution of 40 ml/min, a voltage applied to the spraying head of −90 KV, an ambient temperature during spraying of 25° C. and a relative humidity of 50%. Water vapor was sprayed on the coated layer 2.5 seconds after coating to moisten the layer and 3 seconds after the moistening, hot air (60° C., humidity 10%) was blown on the coated layer for 5 seconds to dry the layer. The height of projections formed on the surface was about 5 μm, the size thereof was about 25 μm on the average and the coated amount of the resin was 130 mg/m².

Then a back coat solution was prepared by dissolving 3.0 parts by weight of vinylidene chloride/acrylonitrile copolymer resin (Salan F-310 available from Asahi Dow Co., Ltd.) in a mixture comprising 70 parts by weight of methyl ethyl ketone and 30 parts by weight of propylene glycol monomethyl ether and then adding 0.05 part by weight of Megafac F-177 (fluorine atom-containing surfactant available from Dainippon Ink and Chemicals, Inc.). The resulting back coat solution was applied onto the back face of the substrate for PS plate to a thickness of 0.2 µm and then dried to give a PS plate 71. A PS plate which was free of any back coat layer was also prepared by way of comparison (Sample 72).

Each of these two kinds of negative-working PS plates thus prepared was packaged and subjected to the trucking test in the same manner used in Example 42. Each PS plate was sandwiched between two sheets of slip paper having a thickness of about 40 µm which had been laminated with a polyethylene film of about 10 µm (Sample 73) and was subjected to the same trucking test. These PS plates were examined on whether scratches during the transportation were present or not and the results were summarized in Table 9.

These three kind of PS plates were subjected to the test in which they were allowed to stand under a large-scale packaged condition for 5 months in the same manner used in Example 42. Thus, the adhesion between the neighbouring PS plates was evaluated. The results (presence or absence of adhesion and peeling off of the films) are summarized in Table 9.

In case of negative-working PS plates, the formation of scratches on the photosensitive layer due to vibration during transportation, the adhesion of the photosensitive layer to the back face of the PS plate under a large-scale packaged condition and the corresponding peeling off of the films could likewise be inhibited by the application of a back coat layer.

TABLE 9

| Ex. No. | Sample No. | Resin for Back Coat (trade name) | Thickness of Back Coat, µm | Scratches Formed (*1) | Adhesion During Storing in Piles (*2) |
|---|---|---|---|---|---|
| 48 | 71 | Salan F-310 | 0.2 | None | None |
| 32* | 72 | — | — | observed | observed |
| 33* | 73 | — | (slip paper was used) | None | None |

*: Comparative Example.
*1: Scratches formed on the photosensitive layer during transportation.
*2: Adhesion between the photosensitive layer and the back face during storing PS plates put in piles.

The structure of the PS plate of the present invention makes it possible to solve the problem of the formation of scratches and the adhesion of the photosensitive layer to the back face of the PS plate even when a large number of PS plates are transported and/or stored while putting them in piles without sandwiching the PS plate between sheets of slip paper. The coated layer applied to the back face of the PS plate is tough and shows good adhesion to the substrate and is not peeled off during handling, development processing and printing operations.

We claim:

1. A presensitized plate for use in making a lithographic priming plate comprising an aluminum plate substrate having a thickness of 0.1 to 0.6 ram; a photosensitive layer and a mat layer whose projections have an average diameter of not more than 100 µm, an average height of not more than 10 µm and whose coated mount ranges from 5 to 200 mg/m$^2$, the photosensitive layer and the mat layer being applied onto the upper surface of the substrate in this order; and a coating layer comprising at least one organic polymeric compound having a glass transition point of not less than 20° C., said coating layer having a thickness ranging from 0.01 to 8.0 µm and being preferably insoluble in water and alkaline developers having a pH of not less than 8.5, said coating layer being applied onto the back face of the substrate wherein the organic polymeric compound is selected from the group consisting of polybutones, polybutadienes, saturated polyester resins, unsaturated polyester resins, polyamides, polyurethanes, polyureas, polyimides, polysiloxanes, polycarbonates, epoxy resins, phenoxy resins, chlorinated polyethylenes, condensed alkylphenol/aldehyde resins, acetal resins, polyvinyl chlorides, polyvinylidene chlorides, polystyrenes, acrylic resins, hydroxycelluloses, polyvinyl alcohols, cellulose acetates and carboxymethyl celluloses.

2. A presensitized plate for use in making a lithographic printing plate comprising an aluminum plate substrate having a thickness of 0.1 to 0.6 mm; a photosensitive layer and a mat layer whose projections have an average diameter of not more than 100 µm, an average height of not more than 10 µm and whose coated amount ranges from 5 to 200 mg/m$^2$, the photosensitive layer and the mat layer being applied onto the upper surface of the substrate in this order; and a coating layer comprising at least one organic polymeric compound having a glass transition point of not less than 20° C. said coating layer having a thickness ranging from 0.01 to 8.0 µm and-being insoluble in water and alkaline developers having a pH of not less than 8.5, said coating layer being applied onto the back face of the substrate wherein the organic polymeric compound is a copolymer having structural units derived from copolymers selected from the group consisting of (meth)acrylamides, (meth)acrylic acid esters and hydroxystyrencs having aromatic hydroxyl groups; (meth)acrylic acid esters having aliphatic hydroxyl groups; methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, glycidyl acrylate, N-dimethylaminoethyl acrylate, methyl methacrylate, ethyl methacrylate, propyl methacrylate, butyl methacrylate, arnyl methacrylate, hexyl methacrylate, cyclohexyl methacrylate, octyl methacrylate, phenyl methacrylate, benzyl methacrylate, 2-chloroethyl methacrylate, glycidyl methacrylate and N-dimethylarninoethyl methacrylate; vinyl esters; vinyl esters; styrenes; vinyl ketones; olefins; N-vinyl pyrrolidone, N-vinyl carbazole, 4-vinyl pyridine, acrylonitrile and methacrylonitrile; and unsaturated sulfonamides of (meth)acrylamides.

3. The presensitized plate of claim 1 wherein the organic polymeric compound has a glass transition point of not less than 30° C.

4. The presensitized plate of claim 1 wherein the organic polymeric compound is at least one member selected from the group consisting of saturated copolymerized polyester resins, phenoxy resins, polyvinyl acetal resins and vinylidene chloride copolymer resins having glass transition points of not less than 20° C.

5. The presensitized plate of claim 1 wherein the coating layer further comprises a plasticizer, a surfactant and/or other additives for imparting flexibility to the coating layer and for controlling slip characteristics of the coating layer.

6. The presensitized plate of claim 5 wherein the plasticizer is a member selected from the group consisting of phthalates, glycol ethers, phosphoric acid esters, aliphatic dibasic acid esters, polyglycidyl methacrylate, triethyl citrate, glycerin triacetate and butyl laurate.

7. The presensitized plate of claim 5 wherein the amount of the plasticizer is up to 30% by weight on the basis of the weight of the polymeric compound used.

8. The presensitized plate of claim 5 wherein the amount of the surfactant ranges from 0.001 to 10% by weight on the basis of the weight of the polymeric compound used.

9. The presensitized plate of claim 1 wherein the coating layer further comprises a dye or pigment, a silane coupling agent, a diazo resin comprising a diazonium salt, an organophosphonic acid, an organophosphoric acid, a cationic polymer, a wax, a higher fatty acid, a higher fatty acid amide, a silicon compound comprising dimethylsiloxane, a modified dimethylsiloxane and/or polyethylene powder.

10. The presensitized plate of claim 1 wherein the coated amount of the mat layer ranges from 20 to 150 mg/m$^2$.

11. The presensitized plate of claim 1 wherein the thickness of the mat layer ranges from 2 to 8 μm.

12. The presensitized plate of claim 1 wherein the photosensitive layer comprises a positive-working photosensitive composition which mainly comprises an o-quinonediazidecompound.

13. The presensitized plate of claim 1 wherein the photosensitive layer comprises a negative-working photosensitive composition.

14. The presensitized plate of claim 13 wherein the negative-working photosensitive composition is a photopolymerizabie compound comprising a diazonium salt, an alkali-soluble diazonium salt or an unsaturated double bond-containing monomer; or cinnamic acid and a dimethylmaleimido group-containing photo-crosslinkable compound.

15. The presensitized plate of claim 1 wherein the plate further comprises an organic underlying layer between the substrate and the photosensitive layer.

16. The presensitized plate of claim 1 wherein the upper surface of the substrate is grained and anodized.

* * * * *